United States Patent
Oh et al.

(10) Patent No.: US 9,355,724 B2
(45) Date of Patent: May 31, 2016

(54) MEMORY SYSTEM COMPRISING NONVOLATILE MEMORY DEVICE AND METHOD OF ADJUSTING READ VOLTAGE BASED ON SUB-BLOCK LEVEL PROGRAM AND ERASE STATUS

(71) Applicants: Eun Chu Oh, Hwaseong-si (KR); Junjin Kong, Yongin-si (KR); Hong Rak Son, Anyang-si (KR)

(72) Inventors: Eun Chu Oh, Hwaseong-si (KR); Junjin Kong, Yongin-si (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 14/076,299

(22) Filed: Nov. 11, 2013

(65) Prior Publication Data

US 2014/0136765 A1 May 15, 2014

(30) Foreign Application Priority Data

Nov. 12, 2012 (KR) ........................ 10-2012-0127596

(51) Int. Cl.
*G11C 16/04* (2006.01)
*G11C 11/56* (2006.01)
*G11C 16/26* (2006.01)
*G11C 16/16* (2006.01)
*G11C 16/14* (2006.01)

(52) U.S. Cl.
CPC ............ *G11C 16/04* (2013.01); *G11C 11/5642* (2013.01); *G11C 16/0483* (2013.01); *G11C 16/26* (2013.01); *G11C 16/14* (2013.01); *G11C 16/16* (2013.01)

(58) Field of Classification Search
CPC ................ G11C 11/5642; G11C 16/16; G11C 16/0483; G11C 16/14; G11C 16/349; G11C 16/3427; G11C 16/3436; G11C 29/50004; G11C 16/04

See application file for complete search history.

(56) References Cited

U.S. PATENT DOCUMENTS

| | | | |
|---|---|---|---|
| 7,616,486 B2 | 11/2009 | Lee | |
| 7,773,427 B2 | 8/2010 | Park et al. | |
| 7,852,676 B2 | 12/2010 | Maejima | |
| 8,107,286 B2 | 1/2012 | Itagaki et al. | |
| 8,107,292 B2 | 1/2012 | Maejima | |
| 8,199,573 B2 | 6/2012 | Fukuzumi et al. | |
| 2009/0003058 A1* | 1/2009 | Kang ..................... | 365/185.03 |
| 2011/0199825 A1 | 8/2011 | Han et al. | |
| 2011/0317489 A1 | 12/2011 | Kim et al. | |
| 2011/0317490 A1 | 12/2011 | Matsui | |
| 2012/0026775 A1 | 2/2012 | Yamada et al. | |
| 2012/0057405 A1 | 3/2012 | Ogiwara et al. | |
| 2012/0099377 A1 | 4/2012 | Maejima | |
| 2012/0134208 A1* | 5/2012 | Lee et al. ................. | 365/185.03 |
| 2012/0163082 A1* | 6/2012 | Confalonieri ............ | 365/185.11 |
| 2012/0170365 A1* | 7/2012 | Kang et al. .............. | 365/185.03 |
| 2013/0083599 A1* | 4/2013 | Nam et al. ............... | 365/185.11 |

FOREIGN PATENT DOCUMENTS

KR 1020120000900 A 1/2012

* cited by examiner

*Primary Examiner* — Richard Elms
*Assistant Examiner* — Ajay Ojha
(74) *Attorney, Agent, or Firm* — Volentine & Whitt, PLLC

(57) ABSTRACT

A method of operating a nonvolatile memory device configured to erase a memory block in sub-block units comprises detecting state information of unselected sub-blocks associated with a selected sub-block comprising selected memory cells, adjusting a read bias of the selected memory cells based on the state information, and reading data from the selected memory cells according to the adjusted read bias. The state information indicates a number of the unselected sub-blocks having a programmed state or an erased state.

20 Claims, 24 Drawing Sheets

Fig. 12

| Full Block | Sub-Block | SB Erase Count | Present Status |
|---|---|---|---|
| BLKi | SB0 | 4 | E |
|  | SB1 | 2 | P |
|  | SB2 | 3 | E |
| BLKi-1 | SB0 | 1 | P |
|  | SB1 | 1 | E |
|  | SB2 | 0 | P |
| BLKi-2 | SB0 | 2 | E |

US 9,355,724 B2

MEMORY SYSTEM COMPRISING NONVOLATILE MEMORY DEVICE AND METHOD OF ADJUSTING READ VOLTAGE BASED ON SUB-BLOCK LEVEL PROGRAM AND ERASE STATUS

CROSS-REFERENCE TO RELATED APPLICATIONS

This application claims priority under 35 U.S.C. §119 to Korean Patent Application No. 10-2012-0127596 filed Nov. 12, 2012, the subject matter of which is hereby incorporated by reference.

BACKGROUND OF THE INVENTION

The inventive concept relates generally to semiconductor memory devices, and more particularly to memory systems comprising nonvolatile memory devices and related read methods.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM) and dynamic random access memory (DRAM). Examples of nonvolatile memory devices include read only memory (ROM), electrically erasable programmable ROM (EEPROM), phase change random access memory (PRAM), and magnetoresistive random access memory (MRAM).

Flash memory, with is a type of EEPROM, is an especially common form of nonvolatile semiconductor memory device. Due to attractive features such as relatively high storage capacity and operating speed, flash memory devices have been employed in a wide range of applications, such as personal computers (PCs), cellular phones, personal digital assistants (PDAs), digital cameras, camcorders, voice recorders, personal media players, and gaming consoles, to name but a few.

In an attempt to improve the storage capacity and performance of flash memory devices, researchers have developed three dimensional (3D) versions of flash memory in which arrays of memory cells are stacked on top of each other. The development of 3D flash memory devices, however, poses new technical challenges that can potentially diminish device reliability or other characteristics. Accordingly, researchers are actively engaged in the development of new techniques to improve performance, reliability, and other aspects of 3D flash memory devices and other forms of nonvolatile memory.

SUMMARY OF THE INVENTION

In one embodiment of the inventive concept, a method is provided for operating a nonvolatile memory device configured to erase a memory block in sub-block units. The method comprises detecting state information of unselected sub-blocks associated with a selected sub-block comprising selected memory cells, adjusting a read bias of the selected memory cells based on the state information, and reading data from the selected memory cells according to the adjusted read bias. The state information indicates a number of the unselected sub-blocks having a programmed state or an erased state.

In another embodiment of the inventive concept, a memory system comprises a nonvolatile memory device comprising a memory block erased in sub-block units, and a memory controller configured to control the nonvolatile memory device to adjust a read bias for selected memory cells in a selected sub-block of the memory block based on state information of other sub-blocks in the memory block. The state information comprises information indicating whether each sub-block is erased and erase counts of the sub-blocks.

In still another embodiment of the inventive concept, a memory controller is configured to control a nonvolatile memory device configured to erase a memory block in sub-block units. The memory controller comprises control logic configured to detect state information of unselected sub-blocks associated with a selected sub-block comprising selected memory cells, and a read voltage adjuster configured to adjust a read bias of the selected memory cells based on the state information. The memory controller reads data from the selected memory cells according to the adjusted read bias, and wherein the state information indicates a number of the unselected sub-blocks having a programmed state or an erased state.

These and other embodiments can potentially improve the reliability of nonvolatile memory devices by adjusting a read voltage to compensate for reductions in read margins due to back pattern dependency and/or program disturbances.

BRIEF DESCRIPTION OF THE DRAWINGS

The drawings illustrate selected embodiments of the inventive concept. In the drawings, like reference numbers indicate like features.

FIG. 12 is a diagram illustrating a sub-block state table of FIG. 11.

DETAILED DESCRIPTION

Figure 1:
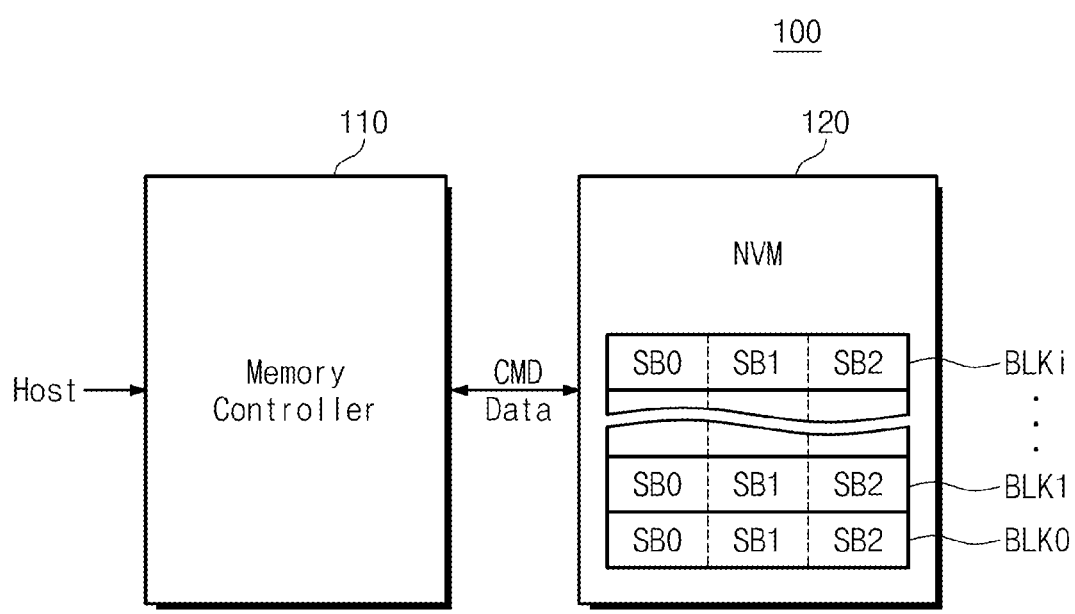
FIG. 1 is a block diagram illustrating a memory system, according to an embodiment of the inventive concept.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features are not to be limited by these terms. Rather, these terms are used merely to distinguish between different features. Accordingly, a first feature discussed below could be termed a second feature without departing from the teachings of the inventive concept.

Spatially relative terms, such as "beneath", "below", "lower", "under", "above", "upper" and the like, may be used herein for ease of description to describe one feature's relationship to another or feature(s) as illustrated in the figures. The spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, where a feature is referred to as being "between" two other features (e.g., between two other layers), it can be the only feature between the two other features, or one or more intervening features may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. Terms such as "comprises", "comprising", "includes", "including," "have", "having", etc., where used in this specification, indicate the presence of stated features but do not preclude the presence or addition of one or more other features. As used herein, the term "and/or" includes any and all combinations of one or more of the associated listed items. Also, the term "exemplary" is intended to refer to an example or illustration.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening elements or layers present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

Below, embodiments of the inventive concept will be described in the context of NAND flash memory technology. However, the inventive concept is not limited to NAND flash memory. For example, in alternative embodiments the flash memory device could be replaced by a PRAM, an MRAM, a ReRAM, a FRAM, or a NOR flash memory.

FIG. 1 is a block diagram illustrating a memory system according to an embodiment of the inventive concept.

Referring to FIG. 1, a memory system 100 comprises a memory controller 110 and a nonvolatile memory device 120.

Memory controller 110 is configured to control nonvolatile memory device 120 in response to a request from a host. Memory controller 110 provides an interface between the host and nonvolatile memory device 120. Memory controller 110 controls write operations of nonvolatile memory device 120 in response to write requests from the host. Memory controller 110 also controls read operations of nonvolatile memory device 120 in response to read commands from the host.

Memory controller 110 comprises a flash translation layer (FTL). Among other things, the FTL can be used to hide erase operations of nonvolatile memory device 120 between a file system of the host and nonvolatile memory device 120. It can also compensate for drawbacks of nonvolatile memory device 120, such as erase-before-write and mismatch between an erase unit and a write unit. In a write operation of nonvolatile memory device 120, the FTL may map a logical address generated by the file system onto a physical address of nonvolatile memory device 120.

Memory controller 110 controls nonvolatile memory device 120 to perform erase operations in units of a sub-block unit. In other words, it causes nonvolatile memory device 120 to erase a sub-block of data at a time. In a read operation, memory controller 110 adjusts a read bias of selected memory cells in a selected sub-block based on states of sub-blocks "associated with" the selected sub-block. Herein, the sub-blocks "associated with" the selected sub-block may be sub-blocks in the same memory block as the selected sub-block, or they may be sub-blocks having heights higher than that of the selected sub-block in a 3D array structure of nonvolatile memory device 120.

Memory controller 110 typically adjusts a read bias of selected memory cells based on program/erased states of the sub-blocks associated with the selected sub-block. Alternatively, memory controller 110 may detect a level of program distance of the selected sub-block due to the associated sub-blocks to adjust a read bias of selected memory cells.

As used herein, the term "memory block" refers to a physical block unit that is capable of being erased as a unit. In a three-dimensional nonvolatile memory device where word lines are stacked in a direction perpendicular to a substrate, a memory block may be a group of cell strings sharing a set of stacked word lines. A sub-block forms part of a memory block and generally comprises memory cells that share a common word line or selection line.

Nonvolatile memory device 120 performs read, write, and erase operations under the control of memory controller 110. Nonvolatile memory device 120 comprises a plurality of memory blocks each having plurality of memory cells arranged in rows and columns. Each memory cell may store single-level data (i.e., one bit) or multi-level data (i.e., multiple bits).

Nonvolatile memory device 120 comprises a plurality of memory blocks BLK1 to BLKi, each of which corresponds to an erase unit. Each of memory blocks BLK1 to BLKi comprises a plurality of memory cells that are stacked in a direction intersecting a substrate to form cell strings.

Each of memory blocks BLK1 to BLKi can be divided into a plurality of sub-blocks. For example, a memory block BLK0 is divided into a plurality of sub-blocks SB0, SB1 and SB2. Herein, it is illustrated that a memory block is divided into three sub-blocks. However, the inventive concept is not limited thereto. For example, a memory block may be divided into two sub-blocks or four or more sub-blocks.

In certain embodiments of the inventive concept, where data stored in a sub-block is read, a read bias on selected memory cells may be adjusted in consideration of program/erased states of remaining sub-blocks. The read bias may be adjusted to compensate for an increase in channel resistance of sub-blocks associated with the selected sub-block. Also, the read bias may be adjusted to compensate for program disturbance which the selected sub-block suffers from the remaining sub-blocks.

Figure 2:
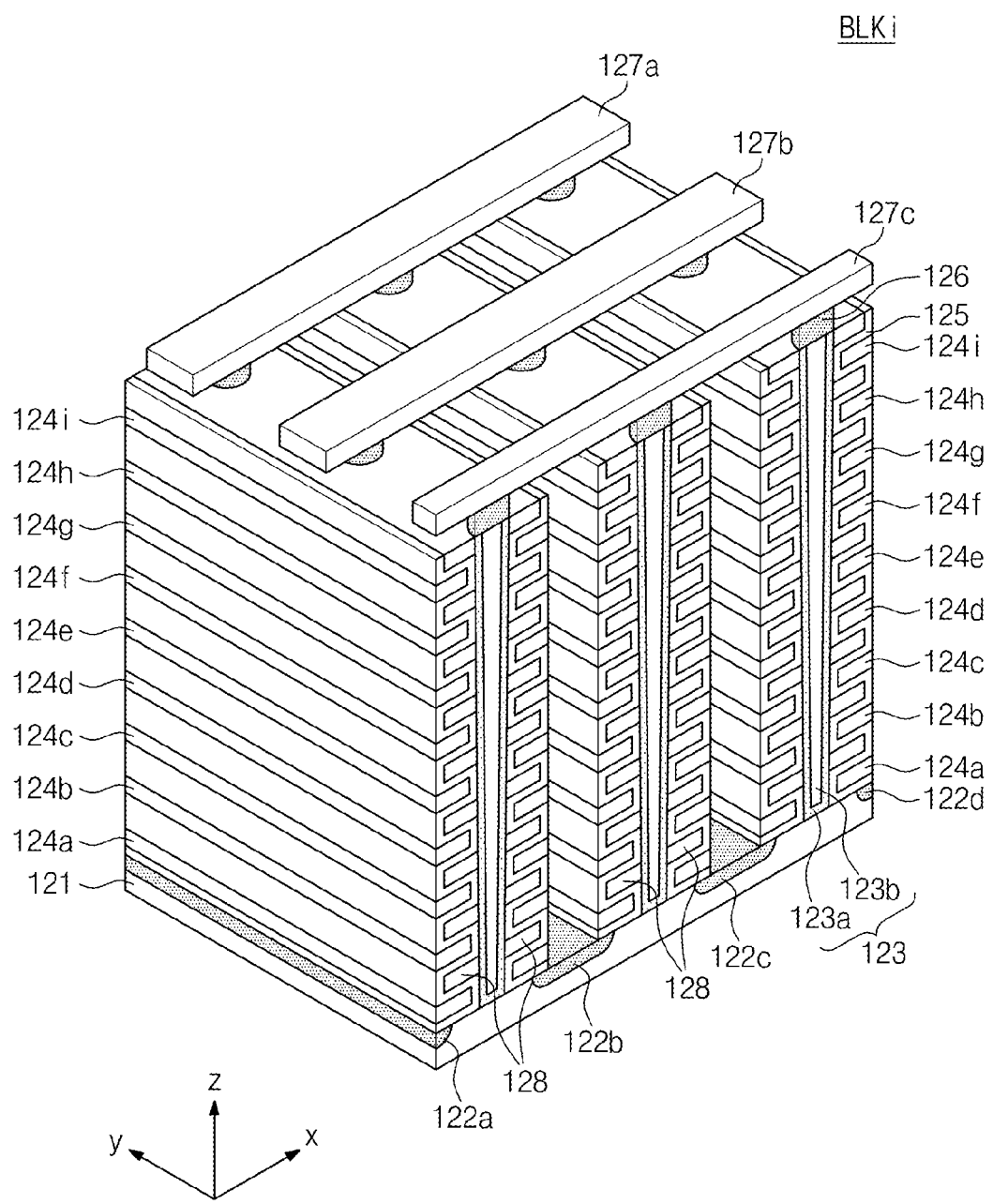
FIG. 2 is a perspective view illustrating a memory block in the memory system of FIG. 1.

FIG. 2 is a perspective view illustrating an example memory block BLKi in FIG. 1. In this example, memory block BLKi comprises structures extending along a plurality of directions x, y, and z.

Referring to FIG. 2, memory block BLKi is disposed on a substrate 121. Substrate 121 can be formed of a p-well in which boron is injected, for example. Alternatively, substrate 121 may be a pocket p-well disposed within an n-well. In the description that follows, it is assumed that substrate 121 is a p-well, although substrate 121 is not limited to the described example.

Substrate 121 comprises a plurality of doping regions 122a, 122b, 122c, and 122d extending along the direction x. For example, doping regions 122a, 122b, 122c, and 122d may be formed of n-type conductors different from that of substrate 121. Below, it is assumed that first to fourth doping regions 122a, 122b, 122c, and 122d are n-type. However, first to fourth doping regions 122a, 122b, 122c, and 122d are not limited to n-type.

A plurality of insulation materials 128 extending along the y-direction are formed sequentially along the z-direction of substrate 121 between first and second doping regions 122a and 122b. Insulation materials 128 are formed to be spaced apart along the z-direction. Insulation materials 128 typically comprise an insulating material such as silicon oxide.

A plurality of pillars 123 are arranged sequentially along the y-direction of substrate 121 between the first and second doping regions 122a and 122b. These pillars penetrate insulation materials 128 along the z-direction. For example, pillars 123 may contact with substrate 121 through insulation materials 128. Herein, pillar 123 may also be formed on substrate 121 between the second and third doping regions 122b and 122c and on the substrate between third and fourth doping regions 122c and 122d.

In general, each pillar 123 may be formed of one or more materials. In one example, a surface layer 123a of each pillar 123 comprises a first type of silicon material, which may include a silicon material having the same type as that of substrate 121. In the description that follows, it is assumed that surface layer 123a of each pillar 123 comprises p-type silicon. However, surface layer 123a of each pillar 123 is not limited to the p-type silicon. In the above example, an inner layer 123b of each pillar 123 is formed of an insulation material. For example, inner layer 123b of each pillar 123 may include an insulation material such as silicon oxide.

An insulation film 125 is disposed between the first and second doping regions 122a and 122b along exposed surfaces of insulation materials 128, pillars 123, and substrate 121. In certain embodiments, insulation film 125 can be removed from an exposed surface (toward the third direction z) of last insulation material 128 disposed along the z-direction.

In a region between first and second doping regions 122a and 122b, first conductive materials 124a to 124i are disposed on an exposed surface of insulation film 125, respectively. For example, first conductive material 124a extending along the y-direction is disposed between substrate 121 and insulation material 128 adjacent to substrate 121. More specifically, first conductive material 124a extending in the x-direction is disposed between substrate 121 and insulation film 125 of a lower surface of insulation material 128 adjacent to substrate 121.

Structures having the same components as first and second doping regions 122a and 122b are disposed between second and third doping regions 122b and 122c, and between third and fourth doping regions 122c and 122d.

Drains 126 are disposed on pillars 123, respectively. Drains 126 may be formed of a second-type of silicon material, such as an n-type silicon material. Below, it is assumed that drains 320 are formed of n-type silicon materials. However, drains 126 are not limited to n-type silicon materials.

Second conductive materials 127a to 127c extending along the x-direction are disposed on drains 126, respectively. Second conductive materials 127a to 127c are disposed sequentially along the y-direction. Second conductive materials 127a to 127c are connected with corresponding drains 126. For example, drains 126 and conductive material 127c extending along the x-direction are connected via contact plugs, respectively.

Herein, each of first conductive materials 124a to 124i forms a word line or a selection line SSL/GSL. As word lines, a subset 124b to 124h of first conductive materials 124a to 124i may be interconnected at the same layer. Memory block BLKi is selected by selecting all of first conductive materials 124a to 124i. On the other hand, a sub-block is selected by selecting only a subset of first conductive materials 124a to 124i.

The number of first conductive materials 124a to 124i is not limited to the described examples, and the number of first conductive materials 124a to 124i can be changed according to various factors such as process and control techniques.

Figure 3:
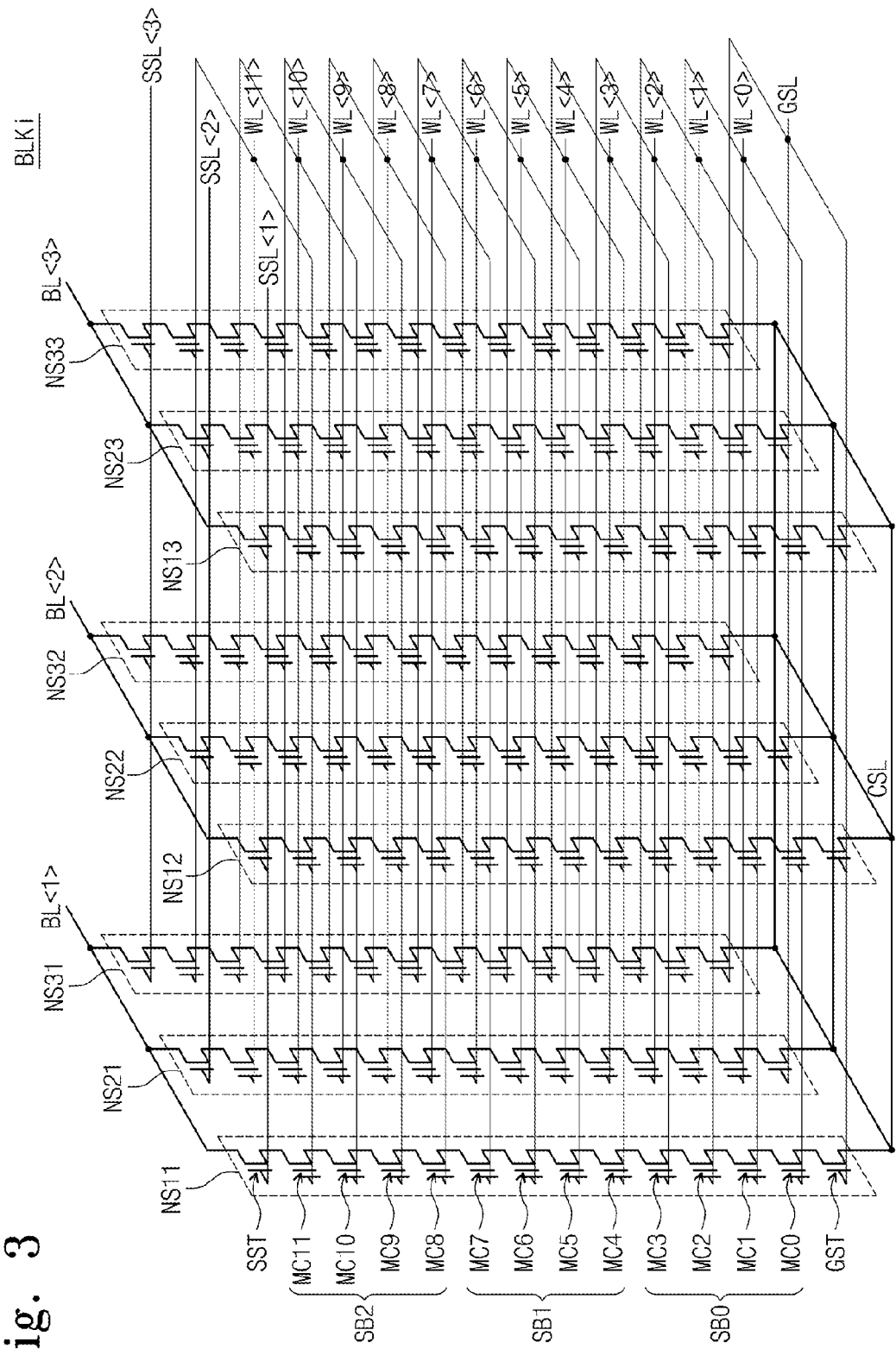
FIG. 3 is a circuit diagram of the memory block illustrated in FIG. 2.

FIG. 3 is a circuit diagram of a memory block BLKi in FIG. 2.

Referring to FIGS. 2 to 3, NAND strings NS11 to NS33 are disposed between bit lines BL<1>, BL<2>, and BL<3> and a common source line CSL.

NAND strings NS11, NS21, and NS31 are disposed between a first bit line BL<1> and common source line CSL. NAND strings NS12, NS22, and NS32 are disposed between a second bit line BL<2> and common source line CSL. NAND strings NS13, NS23, and NS33 are disposed between a third bit line BL<3> and common source line CSL. First to third bit lines BL<1> to BL<3> correspond to second conductive materials 117a to 117c extending in an x-direction, respectively.

A string selection transistor SST of each cell string is connected to a corresponding bit line BL. A ground selection transistor GST of each cell string is connected to common source line CSL. In each cell string, memory cells MC0 to MC11 are disposed between string selection transistor SST and ground selection transistor GST.

In the following description, cell strings are defined by row and column Cell strings connected in common to one bit line form one column. For example, cell strings NS11 to NS31 connected to first bit line BL<1> correspond to a first column Cell strings NS12 to NS32 connected to second bit line BL<2> correspond to a second column Cell strings NS13 to NS33 connected to third bit line BL<3> correspond to a third column.

Cell strings connected to one string selection line SSL form one row. For example, cell strings NS11 through NS13 connected to a first string selection line SSL<1> form a first row. Cell strings NS21 through NS23 connected to a second string selection line SSL<2> form a second row. Cell strings NS31 to NS33 connected to a third string selection line SSL<3> form a third row.

Each cell string comprises a ground selection transistor GST controlled by a ground selection line GSL. Alternatively, although not shown in FIG. 3, cell strings corresponding to each row can be controlled by different ground selection lines.

Memory cells located at the same semiconductor layer share a word line. For example, memory cells MC0 in each of cell strings NS11 to NS33 are connected with a word line WL<0>. Cell strings in the same row share a string selection line SSL, and cell strings in different rows are connected to different string selection lines SSL<1>, SSL<2>, and SSL<3>, respectively. Common source line CSL is connected in common to multiple cell strings. For example, common source line CSL may be formed by interconnecting first to fourth doping regions 122a, 122b, 122c, and 122d.

The above-described memory block BLKi is divided into a plurality of sub-blocks SB0, SB1, and SB2 each smaller in size than memory block BLKi. Sub-blocks SB0, SB1, and SB2 are typically divided in a word line direction. Alternatively, sub-blocks SB0, SB1, and SB2 may be divided on the basis of a bit line or a string selection line. Sub-blocks in memory block BLKi may be erased independently regardless of a reference used to divide a memory block into sub-blocks.

As an example, sub-block SB0 comprises memory cells connected with word lines WL<0>, WL<1>, WL<2>, and WL<3>. Sub-block SB1 comprises memory cells connected with word lines WL<4>, WL<5>, WL<6>, and WL<7>. Sub-block SB2 comprises memory cells connected with word lines WL<8>, WL<9>, WL<10>, and WL<11>. Memory cells in sub-block SB0 can be selected and erased independent of the other sub-blocks SB1 and SB2. One or more of sub-blocks SB0, SB1, and SB2 may be selected and erased at the same time. The above operations may necessitate bias conditions for erasing memory cells by a sub-block unit.

The above description presents a method of dividing sub-blocks defined within one memory block BLKi. However, a reference used to divide one memory block into sub-blocks may not be limited to the described example. For instance, although memory block BLKi is divided into three sub-blocks, the inventive concept is not limited to this detail. As an alternative, for example, one memory block may be divided into two sub-blocks or four or more sub-blocks. Also, a sub-block may include two or three word lines or five or more word lines.

Figure 4A:
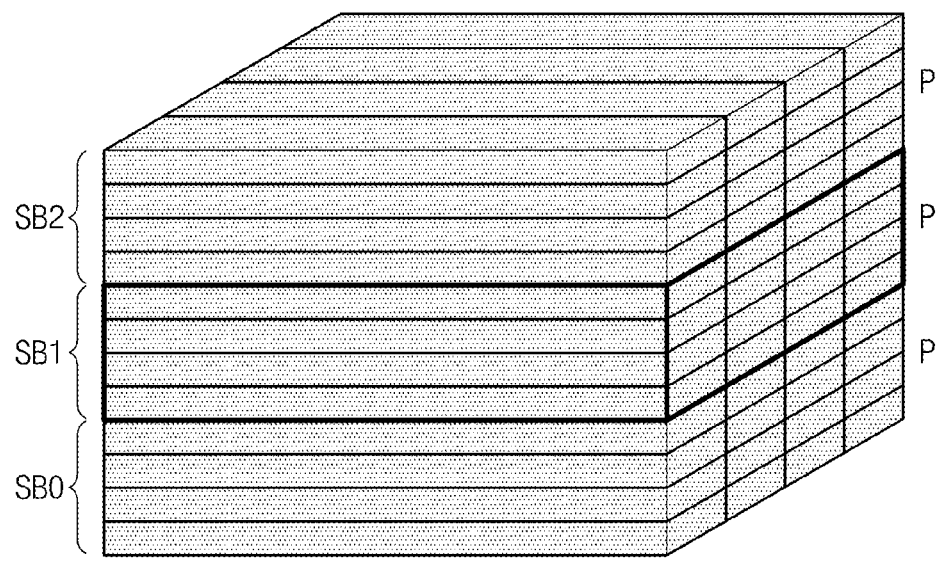
FIG. 4A is a diagram illustrating states of sub-blocks in a memory block.
Figure 4B:
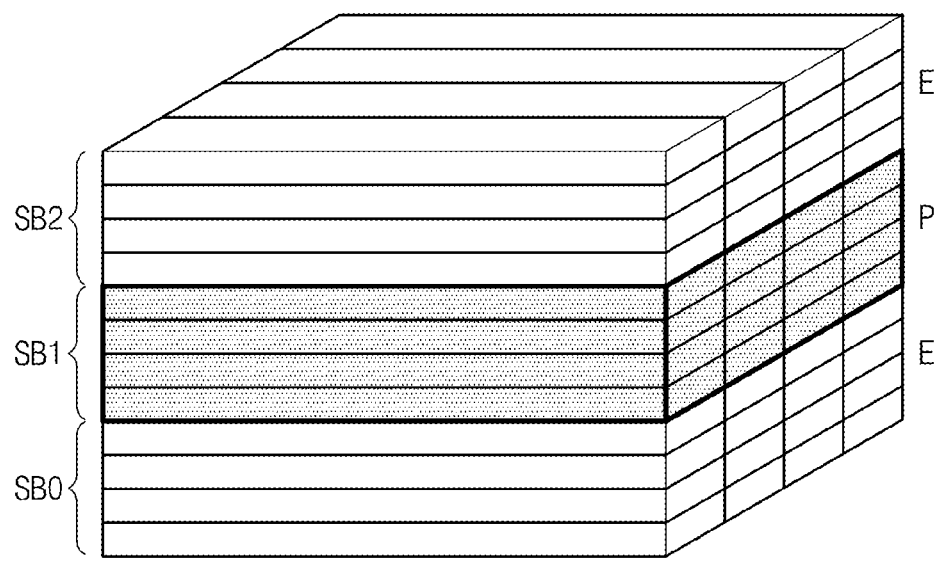
FIG. 4B is another diagram illustrating states of sub-blocks in a memory block.

FIGS. 4A and 4B are diagrams illustrating states of sub-blocks in a memory block. In particular, FIG. 4A shows an example in which all sub-blocks in a memory block are programmed. FIG. 4B shows an example in which sub-blocks SB0 and SB2 in a memory block are in an erased state and a sub block SB1 is programmed. A program order of sub-blocks SB0 to SB2 in a memory block may be sequential (SB0→SB1→SB2), or it may be random.

It is assumed that a word line in a sub-block SB1 is selected in a read operation. In the example of FIG. 4A, sub-blocks SB0 and SB2 are programmed. Thus, threshold voltages of memory cells in sub-blocks SB0 and SB2 are higher than those where sub-blocks SB0 and SB2 are in the erased state. A non-selection read voltage Vread is applied to word lines of sub-blocks SB0 and SB2 to sense memory cells in the selected sub-block. Although memory cells in sub-blocks SB0 and SB2 are turned on by non-selection read voltage Vread, channel resistance of memory cells may increase.

In FIG. 4B, sub-blocks SB0 and SB2 are in the erased state. Thus, threshold voltages of memory cells in sub-blocks SB0 and SB2 may increase compared to those where sub-blocks SB0 and SB2 are in a programmed state.

A non-selection read voltage Vread is provided to word lines of sub-blocks SB0 and SB2 to sense memory cells in selected sub-block SB1. Although memory cells in sub-blocks SB0 and SB2 are turned on by non-selection read voltage Vread, channel resistance of memory cells may decrease compared to that of FIG. 4A.

Although the same memory cells are sensed, cell string resistance may vary according to states of peripheral sub-blocks. This variation may produced by variation in channel current due to varied channel resistance. This phenomenon may reduce read margins and lower the reliability of sensed data. Accordingly, in various embodiments of the inventive concept, a read bias is adjusted on consideration of states of peripheral sub-blocks.

Figure 5:
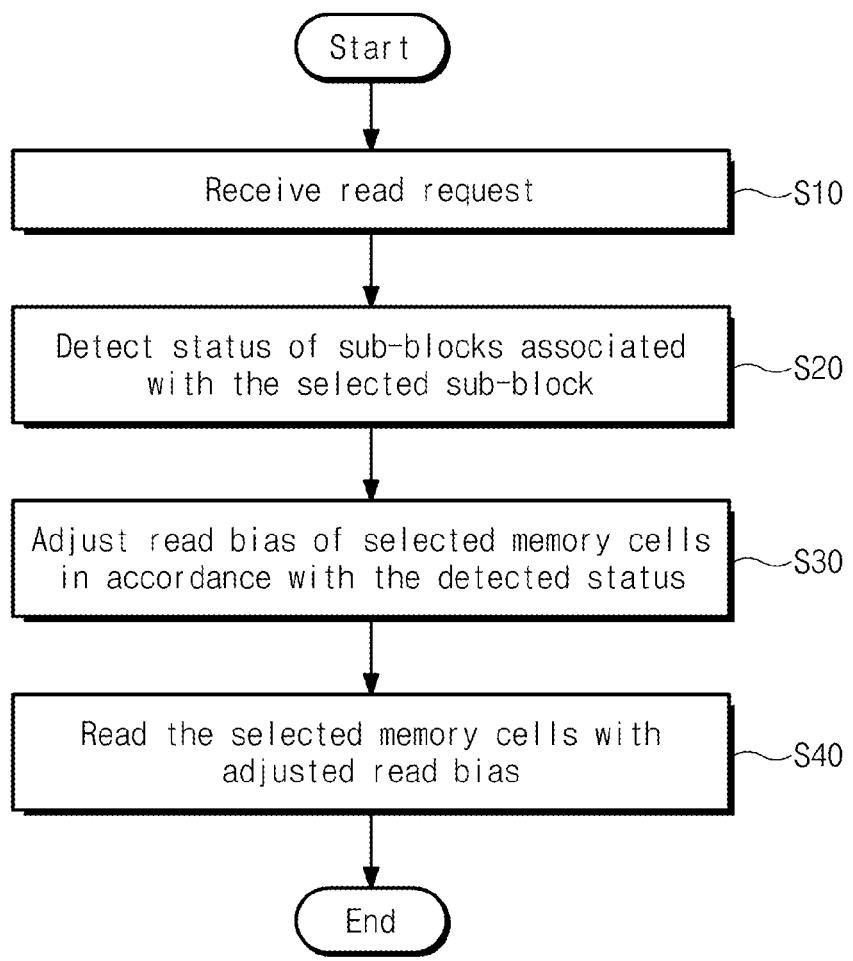
FIG. 5 is a flowchart illustrating a method of reading a nonvolatile memory device, according to an embodiment of the inventive concept.

FIG. 5 is a flowchart illustrating a method of reading a nonvolatile memory device according to an embodiment of the inventive concept.

Referring to FIG. 5, in response to a read request, a read bias is adjusted according to states of remaining sub-blocks associated with a selected sub-block. Memory cells in the selected sub-block are sensed using the adjusted read bias.

In operation S10, a memory controller 110 receives a read request from a host. Herein, various memory management operations except for the read request provided from the host are generated in memory controller 110.

In operation S20, memory controller 110 detects states of sub-blocks associated with the selected sub-block. States of sub-blocks associated with the selected sub-block can be detected according to various alternative methods. For example, program/erased states of sub-blocks in a selected memory block may constitute a table in memory controller 110. Alternatively, a mapping table of the FTL in memory controller 110 may be set to include program/erased states of sub-blocks. Still alternatively, states of sub-blocks may be stored in a reserved area of a memory block in a nonvolatile memory device 120. In response to a read request, memory controller 110 may access the reserved area of the memory block to detect states of sub-blocks.

In operation S330, memory controller 110 determines a read bias for selected memory cells according to the detected program/erased states of sub-blocks. For example, a read voltage Vrd of the selected memory cells may be adjusted according to program/erased states of sub-blocks associated with a selected sub-block. Alternatively, a non-selection read voltage Vread to be provided to unselected word lines may be adjusted according to program/erased states of sub-blocks associated with a selected sub-block. Still alternatively, a sensing time for selected memory cells may be adjusted according to program/erased states of sub-blocks associated with a selected sub-block. A read bias for selected memory cells may be variously adjusted according to program/erased states of sub-blocks associated with a selected sub-block. In operation S40, memory controller 110 performs a read operation on the selected memory cells according to the adjusted read bias.

In the above method, read margin of a nonvolatile memory device erased by a sub-block unit may be increased, which can improve the data integrity of a large-volume nonvolatile memory device.

Figure 6A:
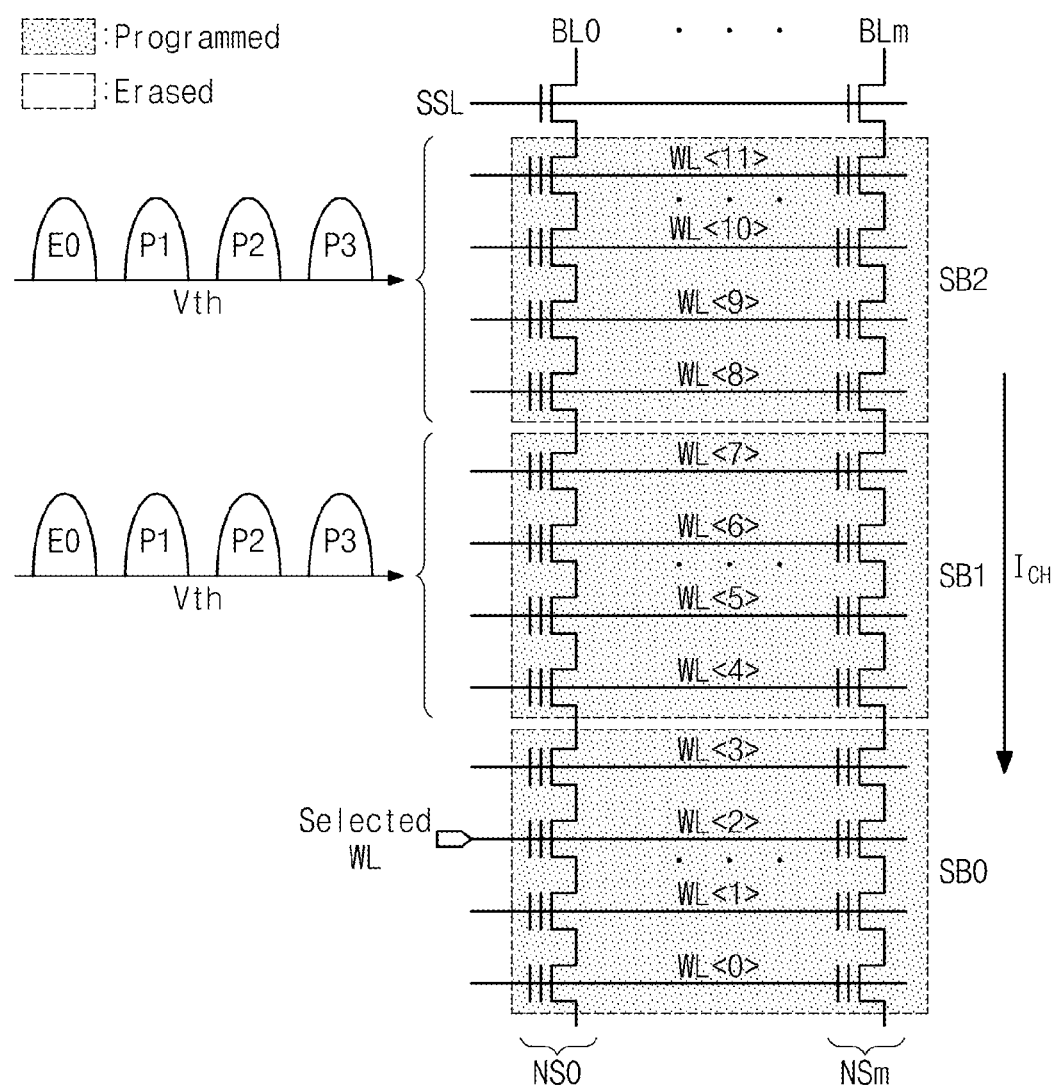
FIG. 6A is a conceptual diagram illustrating a technique for reading a nonvolatile memory device, according to a representative embodiment.
Figure 6B:
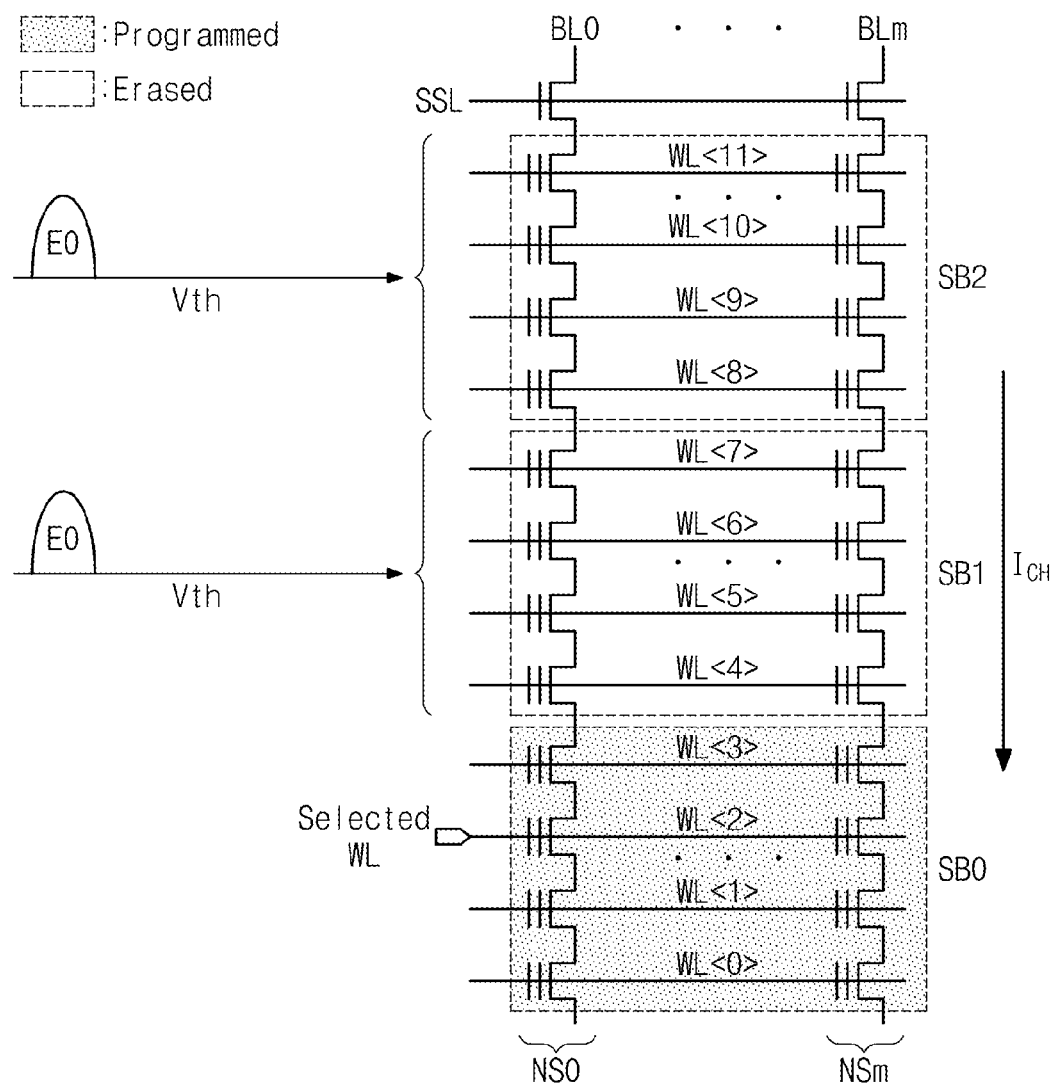
FIG. 6B is a conceptual diagram illustrating a technique for reading a nonvolatile memory device, according to a representative embodiment.

FIGS. 6A and 6B are conceptual diagrams illustrating techniques for reading a nonvolatile memory device, according to a representative embodiment. In the example of FIGS. 6A and 6B, states of sub-blocks stacked on a selected sub-block are used to determine how to adjust a read bias of selected memory cells. More particularly, states of sub-blocks closer to a string selection line SSL than a selected sub-block SB0 are used to determine an adjustment for a read bias. Alternatively, states of sub-blocks farther from a substrate than the selected sub-block SB0 may be used to determine how to adjust a read bias.

Referring to FIG. 6A, it is assumed that a memory block BLKi and a word line WL<2> of a sub-block SB0 are selected in a read operation. Also, it is assumed that sub-blocks SB1 and SB2 are programmed with given data. Threshold voltages of memory cells in sub-blocks SB1 and SB2 placed on the selected sub-block SB0 form threshold voltage distributions illustrated at a left side of FIG. 6A. That is, threshold voltages of memory cells in sub-blocks SB1 and SB2 are distributed to form an erased state E0 and programmed states P1 to P3. A high threshold voltage of a memory cell may mean that a voltage required to turn the memory cell (or, cell transistor) on is high. In other words, a high threshold voltage of a memory cell may mean that channel resistance on a word line voltage is relatively large.

Thus, there may be reduced channel current ICH in a cell string where the same non-selection read voltage Vread is applied to word lines of sub-blocks SB1 and SB2. A decrease in channel current ICH may cause threshold voltages of selected memory cells to be detected with a relatively high level. This phenomenon may be referred to back pattern dependency. Due to this phenomenon, a read operation on selected memory cells may be affected by programmed states of memory cells that are not selected.

Referring to FIG. 6B, it is assumed that a memory block BLKi and a word line WL<2> of a sub-block SB0 are selected in a read operation. Also, it is assumed that sub-blocks SB1 and SB2 are in an erased state. Threshold voltages of unselected memory cells in sub-blocks SB1 and SB2 placed on the selected sub-block SB0 form threshold voltage distributions illustrated at a left side of FIG. 6B. That is, threshold voltages of memory cells in sub-blocks SB1 and SB2 may be distributed to form an erased state E0. A low threshold voltage of a memory cell may mean that a turn-on voltage of the memory cell (or, cell transistor) is low. In other words, where a threshold voltage of a memory cell is low, channel resistance on a word line voltage may be relatively small.

Consequently, increased channel currents ICH may flow in cell strings NS0 to NSm where the same non-selection read voltage Vread is applied to word lines of sub-blocks SB1 and SB2.

The back pattern dependency described with reference to FIGS. 6A and 6B may be compensated for by adjusting a read bias of selected memory cells according to data write states of sub-blocks. In certain embodiments of the inventive concept, program/erased states of sub-blocks stacked on a selected sub-block in a direction perpendicular to a substrate may be used to determine how to adjust a read bias. The reason for referring to these other sub-blocks is that when a program sequence is fixed, a sub-block placed at a lower side of a selected sub-block may always be in a programmed state. However, sub-blocks stacked on the selected sub-block may be in a programmed state or in an erased state.

Figure 7:
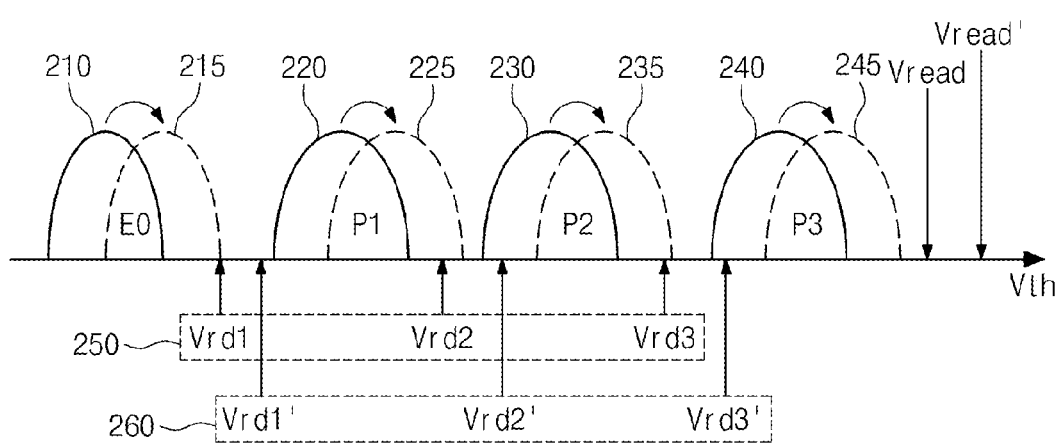
FIG. 7 is a diagram illustrating back pattern dependency and a method for compensating for the back pattern dependency, according to an embodiment of the inventive concept.

FIG. 7 is a diagram illustrating back pattern dependency and a compensation method of the back pattern dependency.

Referring to FIG. 7, a threshold voltage distribution of selected memory cells may vary according to programmed states of sub-blocks stacked on a selected sub-block in a direction perpendicular to a substrate. For example, where sub-blocks SB1 and SB2 stacked on a selected sub-block SB0 in a direction perpendicular to a substrate are in an erased state, threshold voltages of selected memory cells may be distributed to form threshold voltage distributions 210, 220, 230 and 240. That is, because the channel resistances of cell transistors in sub-blocks SB1 and SB2 stacked on the selected sub-block SB0 are relatively small, a channel current flowing through a cell string may be relatively low. Thus, threshold voltages of selected memory cells may be distributed to form relatively low threshold voltage distributions 210, 220, 230 and 240.

On the other hand, where sub-blocks SB1 and SB2 stacked on the selected sub-block SB0 are in a programmed state, threshold voltages of selected memory cells may be distributed to form threshold voltage distributions 215, 225, 235 and 245. That is, because channel resistance of cell transistors of sub-blocks SB1 and SB2 stacked on the selected sub-block SB0 is relatively large, a channel current ICH flowing through a cell string may be relatively low. Thus, threshold voltages of selected memory cells may be distributed to form relatively high threshold voltage distributions 215, 225, 235 and 245.

As indicated by the above description, threshold voltages of selected memory cells may be measured differently according to program/erased states of sub-blocks stacked on a selected sub-block. Thus, the described techniques compensate for varied threshold voltages of selected memory cells according to program/erased states of sub-blocks stacked on a selected sub-block. In various embodiments of the inventive concept, back pattern dependency may be compensated for by adjusting a read bias of selected memory cells according to program/erased states of sub-blocks stacked on a selected sub-block. In certain embodiments of the inventive concept, the read bias to be adjusted may include a selection read voltage Vrd applied to selected memory cells, a non-selection read voltage Vread applied to word lines of unselected memory cells, and a bit line sensing time.

First read voltages Vrd1, Vrd2, and Vrd3 or second read voltages Vrd1', Vrd2', and Vrd3' may be selected as read voltages of selected memory cells according to program/erased states of sub-blocks stacked on a selected sub-block. Alternatively, a first non-selection read voltage Vread or a second non-selection read voltage Vread' applied to word lines of unselected memory cells according to program/erased states of sub-blocks stacked on a selected sub-block. As will be described later, a sensing time on a sensing node may be adjusted according to program/erased states of sub-blocks stacked on a selected sub-block to have a first sensing time T1 or a second sensing time T2 longer than first sensing time T1.

For simplicity, two selection read voltages 250 and 260, two non-selection read voltages Vread and Vread' and two sensing times T1 and T2 are shown in FIG. 7. However, one of read voltages, one of non-selection read voltages, or one of various sensing times may be selected.

Figure 8:
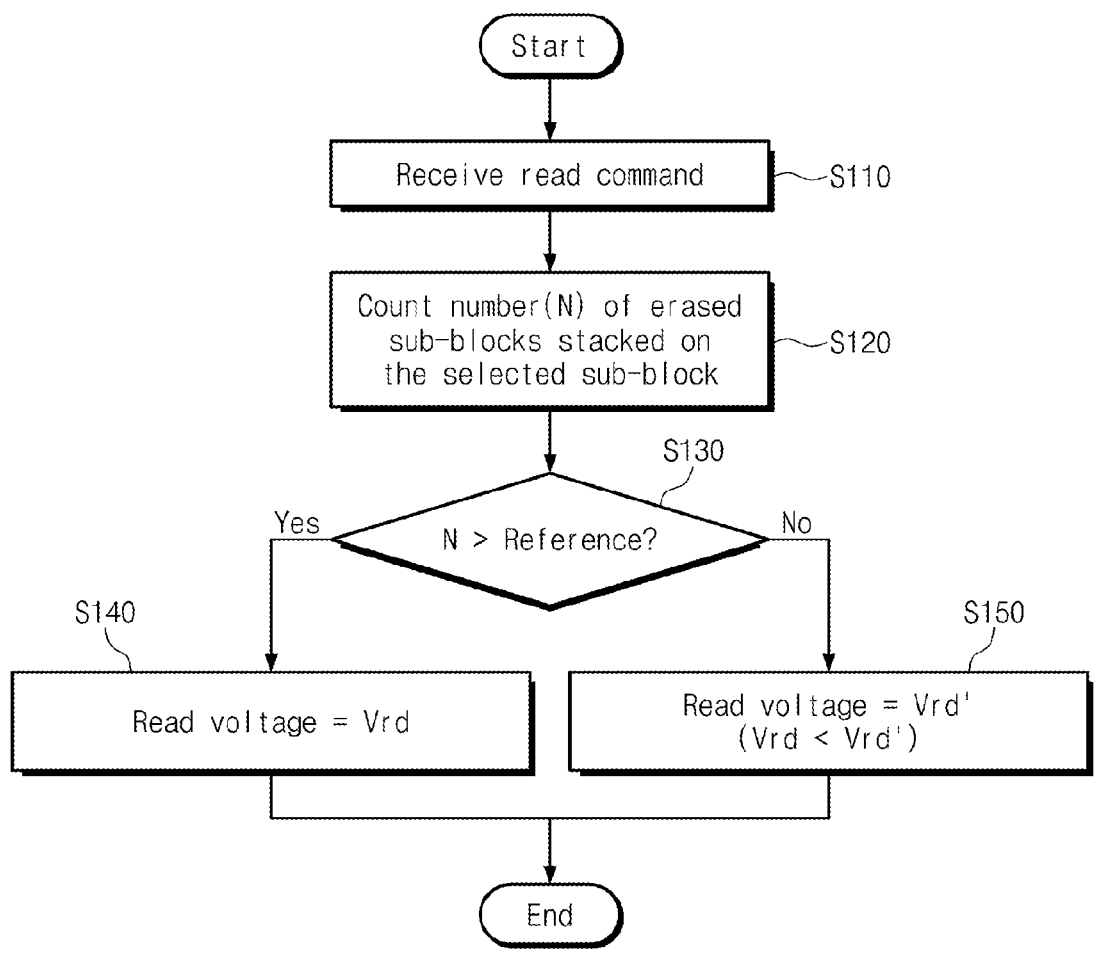
FIG. 8 is a flowchart illustrating a method of adjusting a selection read voltage according to states of sub-blocks associated with a selected sub-block, according to an embodiment of the inventive concept.

FIG. 8 is a flowchart illustrating a method of adjusting a selection read voltage according to states of sub-blocks associated with a selected sub-block.

Referring to FIG. 8, a selection read voltage to be applied to selected memory cells is determined according to states of sub-blocks stacked on a selected sub-block. The selected memory cells are sensed according to the determined read voltages.

In operation S110, memory controller 110 receives a read request or a read command from a host. In operation S120, memory controller 110 detects program/erased states of sub-blocks stacked on a selected sub-block. The number of sub-blocks in an erased state may be counted to detect program/erased states of sub-blocks stacked on a selected sub-block. Memory controller 110 may refer to a mapping table of an FTL, a table separately managed to store states of sub-blocks, or state information of sub-blocks stored in a reserved area of nonvolatile memory device 120.

In operation S130, memory controller 110 determines whether the number of sub-blocks in an erased state exceeds a reference value. Where the number of sub-blocks in an erased state exceeds the reference value, the method proceeds to operation S140. Otherwise, if the number of sub-blocks in an erased state does not exceed the reference value, the method proceeds to operation S150.

In operation S140, memory controller 110 selects a first selection read voltage Vrd to sense selected memory cells. In operation S150, memory controller 110 selects a second selection read voltage Vrd' to sense selected memory cells. Although not shown in figures, thereafter memory controller 110 may control nonvolatile memory device 120 to sense the selected memory cells using one selected from a group of first selection read voltage Vrd and second selection read voltage Vrd'.

In the example of FIG. 8, memory controller 110 counts the number of sub-blocks in an erased state, from among sub-blocks stacked on a selected sub-block. A selection read voltage to be applied to a word line of selected memory cells is determined based on the number of sub-blocks in the erased state.

Figure 9:
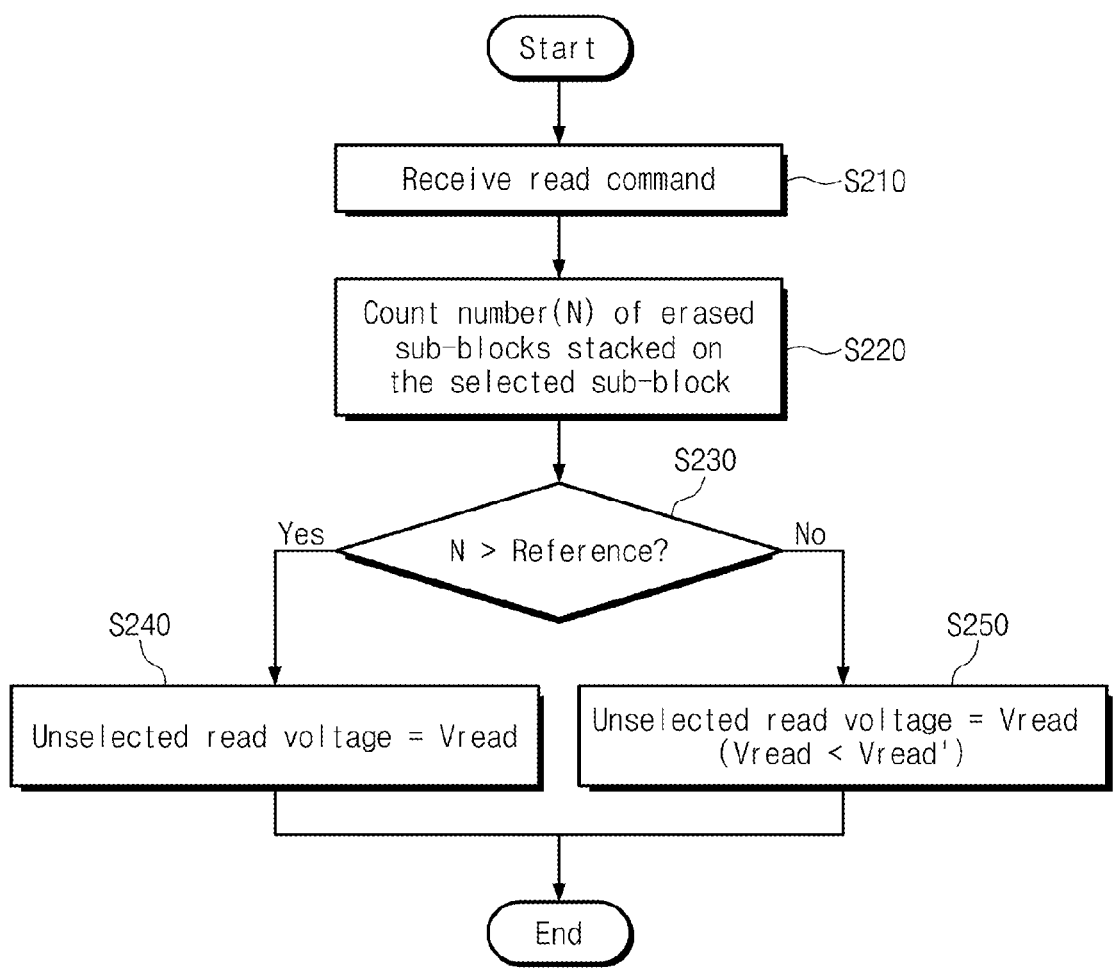
FIG. 9 is a flowchart illustrating a method of adjusting a non-selection read voltage according to an embodiment of the inventive concept.

FIG. 9 is a flowchart illustrating a method of adjusting a non-selection read voltage according to an embodiment of the inventive concept.

Referring to FIG. 9, in a read operation, a non-selection read voltage to be applied to unselected memory cells is determined according to states of sub-blocks stacked on a selected sub-block. Operations S210, S220 and S230 of FIG. 9 may be substantially the same as operations S110, S120 and S130 of FIG. 8, so a detailed description of those operations will be omitted to avoid redundancy.

In operation S210, a read command is received. In operation S220, the number of sub-blocks in an erased state is counted. In operation S230, memory controller 110 determines whether the number of sub-blocks in the erased state exceeds a reference value. If the number of sub-blocks in the erased state exceeds the reference value, the method proceeds to operation S240. If the number of sub-blocks in the erased state does not exceed the reference value, the method proceeds to operation S250.

In operation S240, memory controller 110 selects a first non-selection read voltage Vread. In operation S250, memory controller 110 selects a second non-selection read voltage Vread' higher than first non-selection read voltage Vread. Although not shown in figures, afterwards, memory controller 110 controls nonvolatile memory device 120 such that one of first non-selection read voltage Vread and second non-selection read voltage Vread' is applied to word lines of unselected memory cells. Memory controller 110 controls nonvolatile memory device 120 to sense selected memory cells according to a predetermined read voltage.

In the example of FIG. 9, memory controller 110 counts the number of sub-blocks in an erased state, from among sub-blocks stacked on a selected sub-block. A non-selection read voltage to be applied to unselected word lines is determined based on the counted number of sub-blocks in the erased state.

Figure 10:
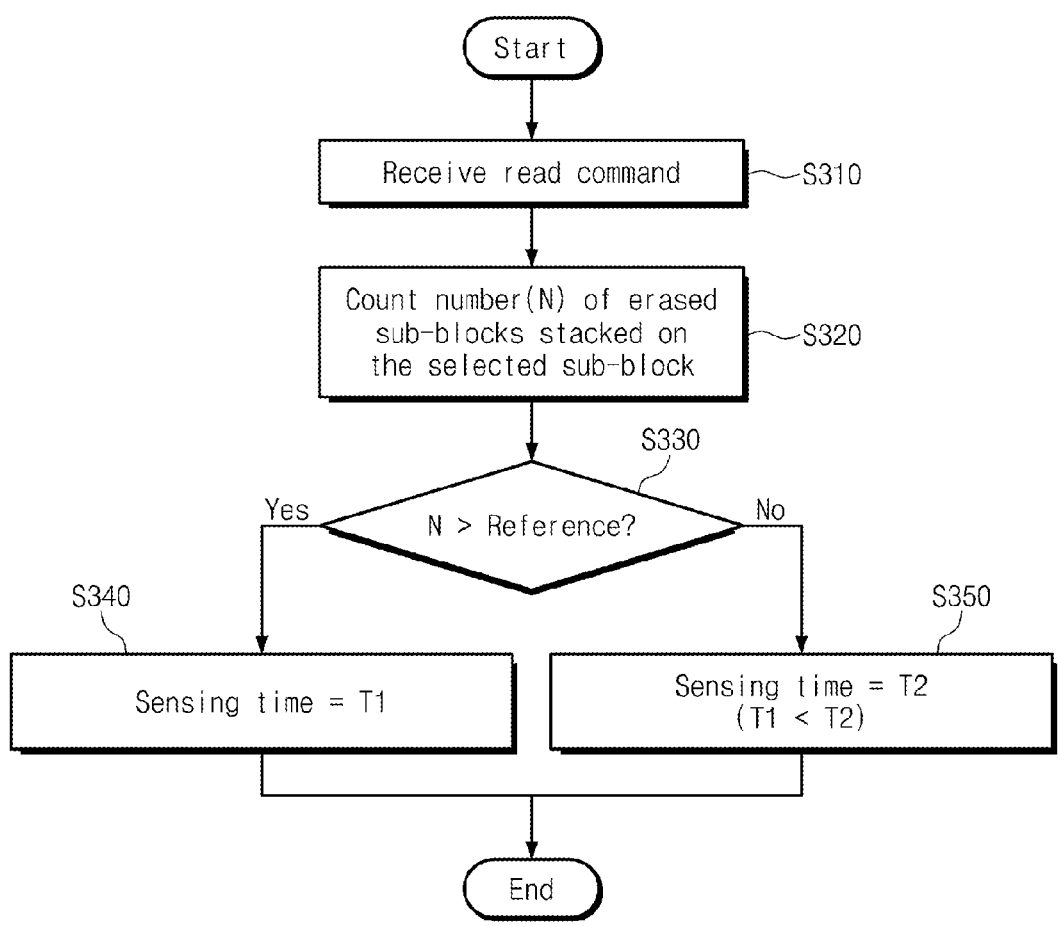
FIG. 10 is a flowchart illustrating a method of adjusting a sensing time according to an embodiment of the inventive concept.

FIG. 10 is a flowchart illustrating a method of adjusting a sensing time, according to an embodiment of the inventive concept.

Referring to FIG. 10, in a read operation, a sensing node sensing time corresponding to selected memory cells is determined according to states of sub-blocks stacked on a selected sub-block. Operations S310, S320 and S330 of FIG. 10 are substantially the same as operations S110, S120 and S130 of FIG. 8, so a detailed description thereof is thus omitted in order to avoid redundancy.

In operation S310, a read command is received. In operation S320, the number of sub-blocks in an erased state is counted. In operation S330, a memory controller 110 determines whether the number of sub-blocks in the erased state exceeds a reference value. Where the number of sub-blocks in an erased state exceeds the reference value, the method proceeds to operation S340. Otherwise, where the number of sub-blocks in an erased state does not exceed the reference value, the method proceeds to operation S350.

In operation S340, memory controller 110 selects a first time T1 as a sensing time to sense sensing nodes of selected memory cells. In operation S350, memory controller 110 selects a second time T1 longer than first time T1 as a sensing time to sense sensing nodes of selected memory cells. Although not shown in figures, afterwards, memory controller 110 controls nonvolatile memory device 120 to sense sensing nodes of selected memory cells during selected time T1 or T2.

In the example of FIG. 10, memory controller 110 counts the number of sub-blocks in an erased state, from among sub-blocks stacked on a selected sub-block. A sensing time for sensing selected memory cells is determined based on the number of sub-blocks in an erased state.

Figure 11:
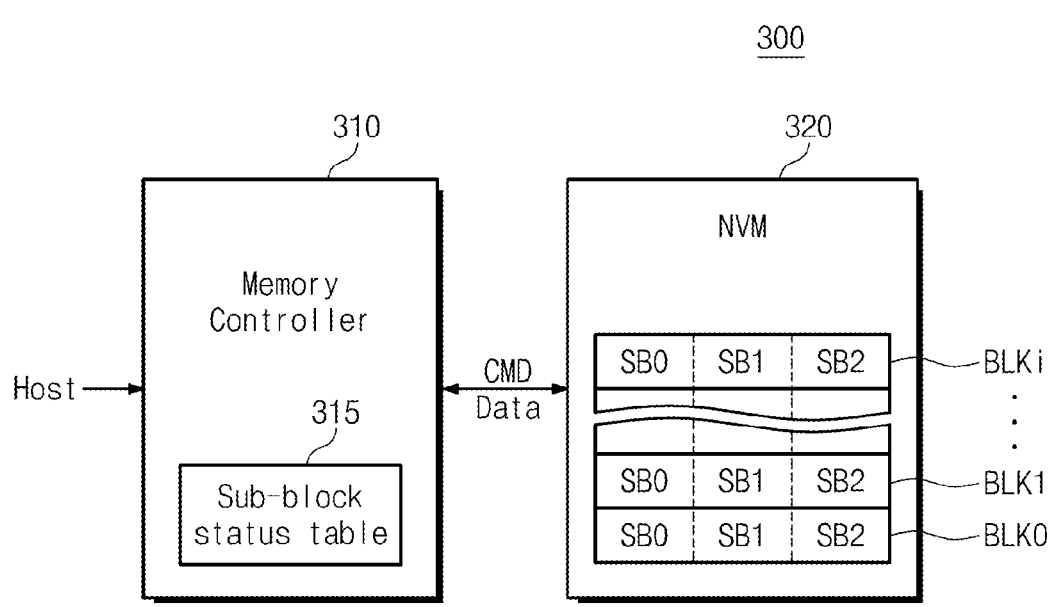
FIG. 11 is a block diagram illustrating a memory system according to another embodiment of the inventive concept.

FIG. 11 is a block diagram illustrating a memory system, according to another embodiment of the inventive concept.

Referring to FIG. 11, a memory system 300 comprises a memory controller 310 and a nonvolatile memory device 320. Memory controller 310 stores state information of sub-blocks corresponding to each of memory blocks. Memory controller 310 adjusts a read bias of selected memory cells based on the state information of the sub-blocks.

Memory controller 310 comprises a sub-block state table 315 for updating state information of sub-blocks in each of the memory blocks. Sub-block state table 315 can be loaded and updated on a high-speed SRAM. Sub-block state table 315 can be stored in a specific area of nonvolatile memory device 320, either periodically or at a designated time. At power-off, memory controller 310 writes sub-block state information of sub-block state table 315 in a designated area of nonvolatile memory device 320. At power-on, memory controller 310 reads sub-block state information stored in the designated area of nonvolatile memory device 320 to produce sub-block state table 315.

Memory controller 310 controls nonvolatile memory device 320 to perform an erase operation by a sub-block unit. In a read operation, memory controller 310 adjusts a read bias of selected memory cells according to states of sub-blocks in a memory block including a selected sub-block. Memory controller 310 adjusts a read bias according to program/erased states of sub-blocks in a memory block including selected memory cells. Alternatively, memory controller 310 may detect a level of program distance of a selected sub-block to adjust a read bias of selected memory cells.

Nonvolatile memory device 320 comprises a plurality of memory blocks BLK1 to BLKi, each comprising a plurality of memory cells that are stacked in a direction intersecting a substrate to form cell strings. Each of memory blocks BLK1 to BLKi can be divided into a plurality of sub-blocks. That is, a memory block BLK0 may be divided into three sub-blocks SB0 to SB2. However, the inventive concept is not limited thereto. For example, a memory block may be divided into two sub-blocks or four or more sub-blocks.

FIG. 12 is a diagram illustrating a sub-block state table of FIG. 11.

Referring to FIG. 12, sub-block state table 315 comprises program/erased states of sub-blocks in each of memory blocks. Sub-block state table 315 also comprises erase counts of sub-blocks after erasing of a memory block. It is assumed that one memory block BLKi is divided into three sub-blocks.

Erase counts of sub-blocks SB0 to SB2 in memory blocks BLKi and current program/erased states are recorded in a sub-block state table. That is, an erase count of sub-block SB0 in memory blocks BLKi may be 4 and a current program/erased state of sub-blocks SB0 may correspond to erased state E. This may mean sub-blocks SB0 in memory blocks BLKi are erased four times after a full block erase operation of memory blocks BLKi. Sub-blocks SB0 of memory block BLKi maintain erased state E after they are erased four times.

An erase count of sub-block SB1 in memory blocks BLKi may be 2 and sub-block SB1 may have a programmed state P. This may mean sub-blocks SB1 in memory blocks BLKi are erased two times after a full block erase operation of memory blocks BLKi. Sub-blocks SB1 in memory blocks BLKi may maintain a programmed state P after sub-blocks SB1 are erased two times.

An erase count of sub-blocks SB1 in memory blocks BLKi may be 3 and sub-blocks SB2 may have erased state E. This may mean sub-blocks SB2 in memory blocks BLKi maintain erased state E after sub-blocks SB2 are erased three times.

Memory controller 310 retains and manages erase counts and program/erased states of sub-blocks in each memory block using a sub-block state table. Memory controller 310 adjusts a read bias of selected memory cells according to the sub-block state table. Also, memory controller 310 backs up information that has been updated in the sub-block state table in a designated area of nonvolatile memory device 320, either periodically or at a predetermined time.

Figure 13A:
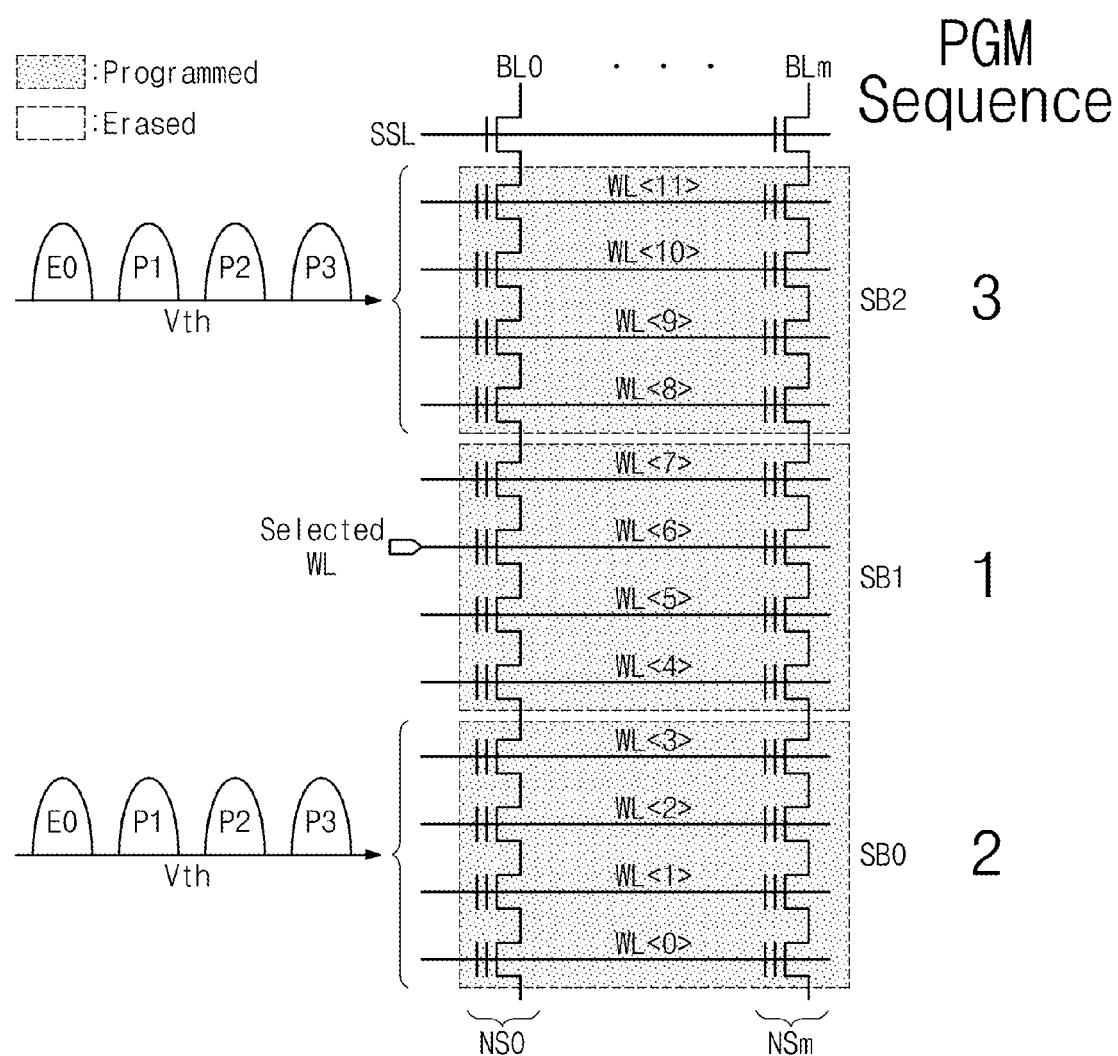
FIG. 13A is a diagram illustrating an example in which a read bias is adjusted in consideration of current program/erased states of sub-blocks.
Figure 13B:
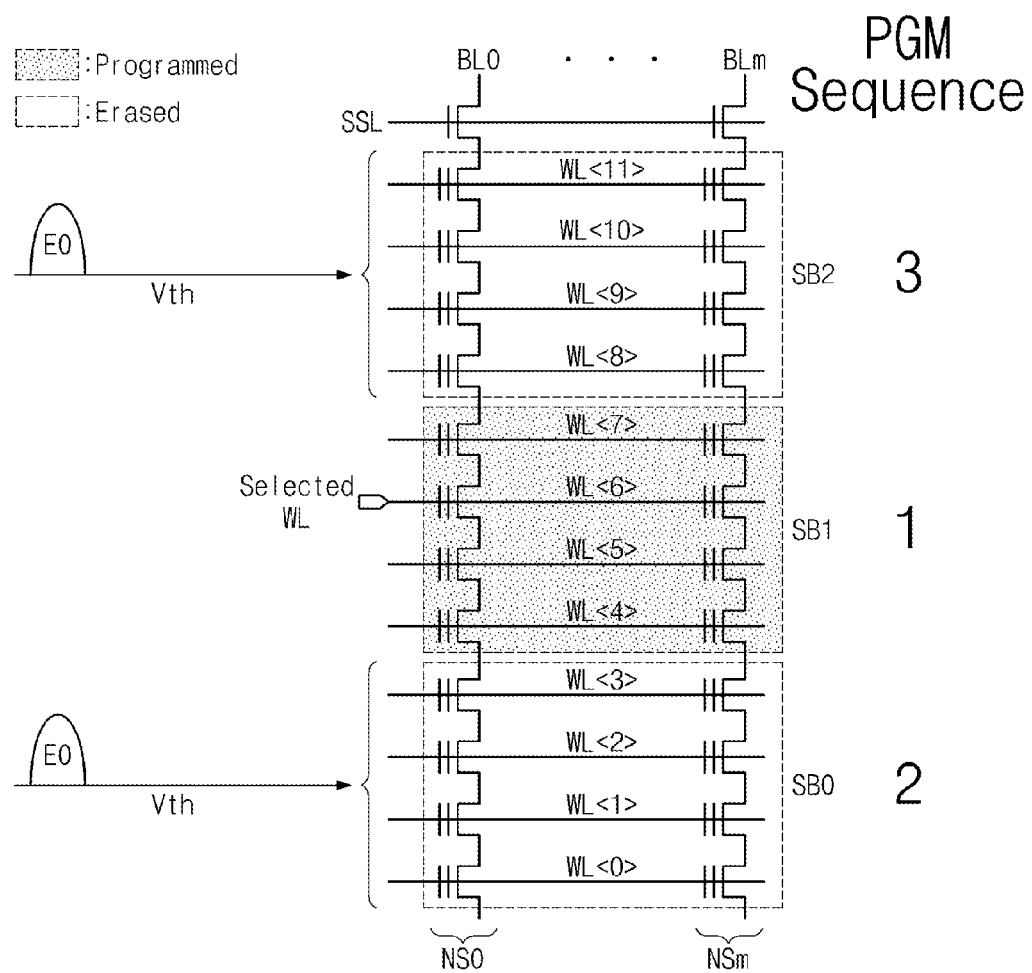
FIG. 13B is another diagram illustrating an example in which a read bias is adjusted in consideration of current program/erased states of sub-blocks.

FIGS. 13A and 13B are diagrams illustrating an example in which a read bias is adjusted in consideration of current program/erased states of sub-blocks. Herein, sub-blocks associated with a selected sub-block may include sub-blocks placed at upper layers of the selected sub-block and sub-blocks placed at lower layers of the selected sub-block. It is assumed that sub-blocks SB0 to SB2 are programmed according to such a sequence as SB1→SB0→SB2.

Referring to FIG. 13A, all sub-blocks associated with a selected sub-block are in a programmed state. For example, in a read operation, sub-blocks SB0 and SB2 associated with a selected sub-block SB1 are in a programmed state. Thus, threshold voltages of memory cells in sub-blocks SB0 and SB2 are higher than those where sub-blocks SB0 and SB2 have an erased state. A read bias of selected memory cells is adjusted according to current program states of sub-blocks SB0 and SB2 associated with the selected sub-block SB1.

Referring to FIG. 13B, all sub-blocks associated with a selected sub-block are in an erased state. For example, in a read operation, sub-blocks SB0 and SB2 associated with a selected sub-block SB1 are in an erased state. Thus, memory cells in sub-blocks SB0 and SB2 have relatively low threshold voltages. A read bias of selected memory cells is adjusted to accord with such conditions.

Figure 14:
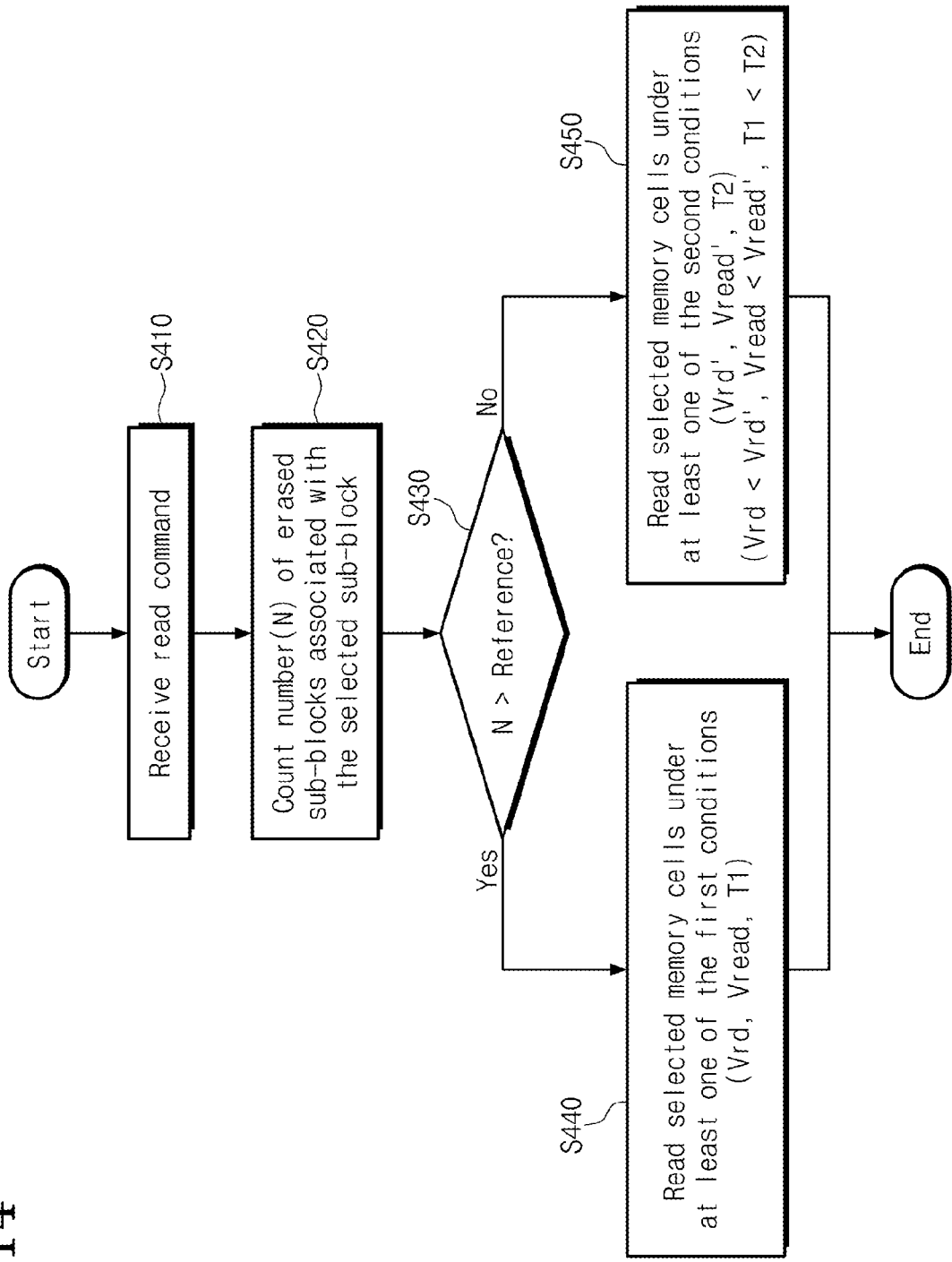
FIG. 14 is a flowchart illustrating a method of adjusting a read bias according to current program/erased states of sub-blocks associated with a selected sub-block.

FIG. 14 is a flowchart illustrating a method of adjusting a read bias according to current program/erased states of sub-blocks associated with a selected sub-block.

Referring to FIGS. 11 and 14, various read biases (e.g., Vrd, Vread and sensing time) to be applied to selected memory cells are determined according to states of sub-blocks associated with a selected sub-block.

In operation S410, memory controller 310 receives a read request or a read command from a host. Program/erased state information of sub-blocks in each of memory blocks BLK0 to BLKi is updated in real time using a sub-block state table 315 in memory controller 310. In some embodiments, sub-block state table 315 is loaded on a high-speed working memory such as an SRAM. Alternatively, sub-block state table 315 may be formed by a mapping table managed by FTL by a sub-block unit.

In operation S420, memory controller 310 counts the number of sub-blocks, in an erased state, from among sub-blocks associated with a selected sub-block. In operation S430, memory controller 310 determines whether the number of sub-blocks in the erased state exceeds a reference value. Where the number of sub-blocks in an erased state exceeds the reference value, the method proceeds to operation S440. Otherwise, where the number of sub-blocks in an erased state does not exceed the reference value, the method proceeds to operation S450.

In operation S440, memory controller 310 selects one of first read conditions for sensing the selected memory cells. For example, memory controller 310 may select a first read voltage Vrd to sense the selected memory cells. Alternatively, memory controller 310 may select a first non-selection read voltage Vread to be applied to an unselected word line when sensing the selected memory cells. Still alternatively, memory controller 310 may select a first sensing time T1 for sensing a sensing node when sensing the selected memory cells.

In operation S450, memory controller 310 selects one of second read conditions to sense the selected memory cells. For example, memory controller 310 may select a second read voltage Vrd' to sense the selected memory cells. Alternatively, memory controller 310 may select a second non-selection read voltage Vread', higher than the first non-selection read voltage Vread, to be applied to an unselected word line when sensing the selected memory cells. Still alternatively, memory controller 310 may select a second sensing time T2 longer than first sensing time T1 for sensing a sensing node when sensing the selected memory cells.

Although not shown in figures, memory controller 310 may control a nonvolatile memory device 320 to sense the selected memory cells using one selected from the first and second read conditions.

In the example of FIG. 14, memory controller 310 counts the number of sub-blocks, in an erased state, from among sub-blocks associated with a selected sub-block. A bias condition to be applied to selected memory cells is determined based on the number of sub-blocks in the erased state.

Figure 15:
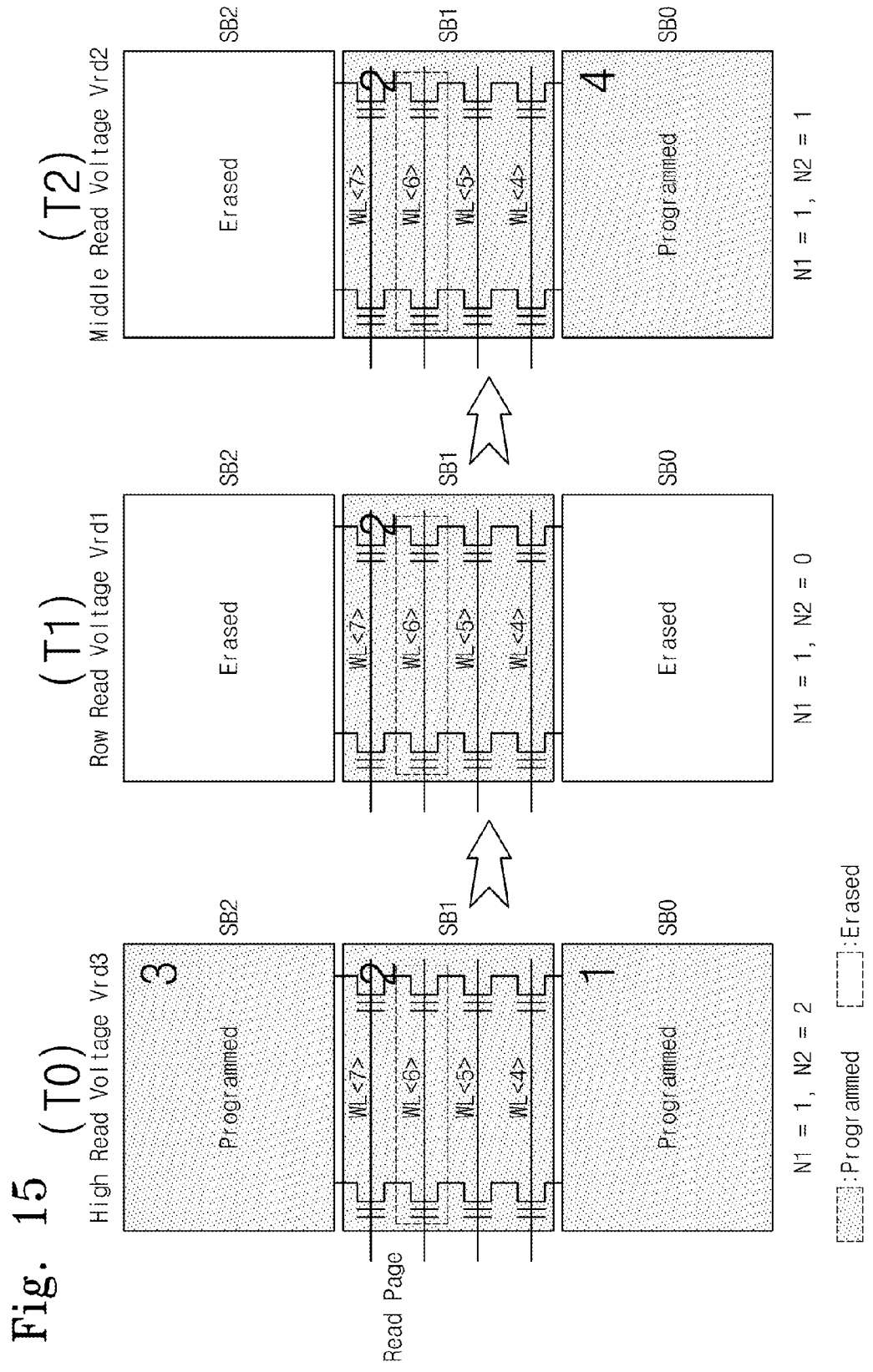
FIG. 15 is a diagram illustrating states of sub-blocks, according to still another embodiment of the inventive concept.

FIG. 15 is a diagram illustrating states of sub-blocks according to still another embodiment of the inventive concept. Examples of a parameter (N1-N2) for considering both current program/erased states of sub-blocks associated with a selected sub-block and a level of program disturbance the selected sub-block experiences will be described with reference to FIG. 15. A read bias for selected memory cells is adjusted according to the parameter (N1-N2). Herein, each of times T0, T1 and T2 corresponds to a point of time where memory cells of a selected sub-block SB1 are read.

At time T0, sub-blocks SB0, SB1 and SB2 may be in a programmed state after a full block erase operation. Sub-blocks SB0, SB1 and SB2 may be sequentially programmed according to such a program sequence as SB0→SB1→SB2. The program sequence may be freely changed, not fixed. Sub-block SB1 selected for a read operation is programmed following sub-block SB0. Sub-block SB1 selected for a read operation is programmed before sub-block SB2 is programmed. Thus, a value N1 indicating the number of sub-blocks programmed before sub-block SB1 selected for a read operation is programmed is '1'. A value N2 indicating the number of sub-blocks having a programmed state at a point of time when sub-block SB1 is read is '2'. At T0, the parameter (N1-N2) may have a value of '−1' (1-2).

Time T1 corresponds to a point of time where sub-blocks SB0 and SB2 are erased after time T0. Thus, as sub-blocks SB0 and SB2 are erased, the equivalent resistance of a cell string may be relatively small. At time T1, a value N1 indicating the number of sub-blocks programmed before sub-block SB1 selected for a read operation is programmed is '1'. A value N2 indicating the number of sub-blocks having a programmed state at time T1 where sub-block SB1 is read is '0'. At T0, the parameter (N1-N2) has a value of '1' (1-0).

Time T2 corresponds to a point of time after data is written at sub-block SB0 after time T1. At time T2, a value N1 indicating the number of sub-blocks programmed before sub-block SB1 selected for a read operation is programmed is '1'. A value N2 indicating the number of sub-blocks having a programmed state at the point of time T1 when sub-block SB1 is read is '1'. At time T0, the parameter (N1-N2) has a value of '0' (1-1).

In each sub-block, a value N1 indicating the number of sub-blocks programmed before a sub-block selected for a read operation is programmed and a value N2 indicating the number of sub-blocks having a programmed state at a point of time when the selected sub-block is read may be used as a parameter for adjusting a read bias. The parameter (N1-N2) may be used to compensate for a condition difference between a point of time where a selected sub-block is programmed and a point of time where the selected sub-block is read. A read bias may be adjusted to compensate for a condition difference between a program point of time and a read point of time of the selected sub-block.

As an example of adjusting a read bias, at time T0, the highest read voltage Vrd3 may be used as a read voltage of selected memory cells. At time T1, the lowest read voltage Vrd1 may be used as a read voltage of selected memory cells. At time T2, an intermediate read voltage Vrd2 may be used as a read voltage of selected memory cells. Herein, read voltages Vrd1, Vrd2, and Vrd3 may be exemplarily described as a read bias. However, the inventive concept is not limited thereto. For example, a sensing time or a non-selection read voltage Vread can be adjusted.

Figure 16:
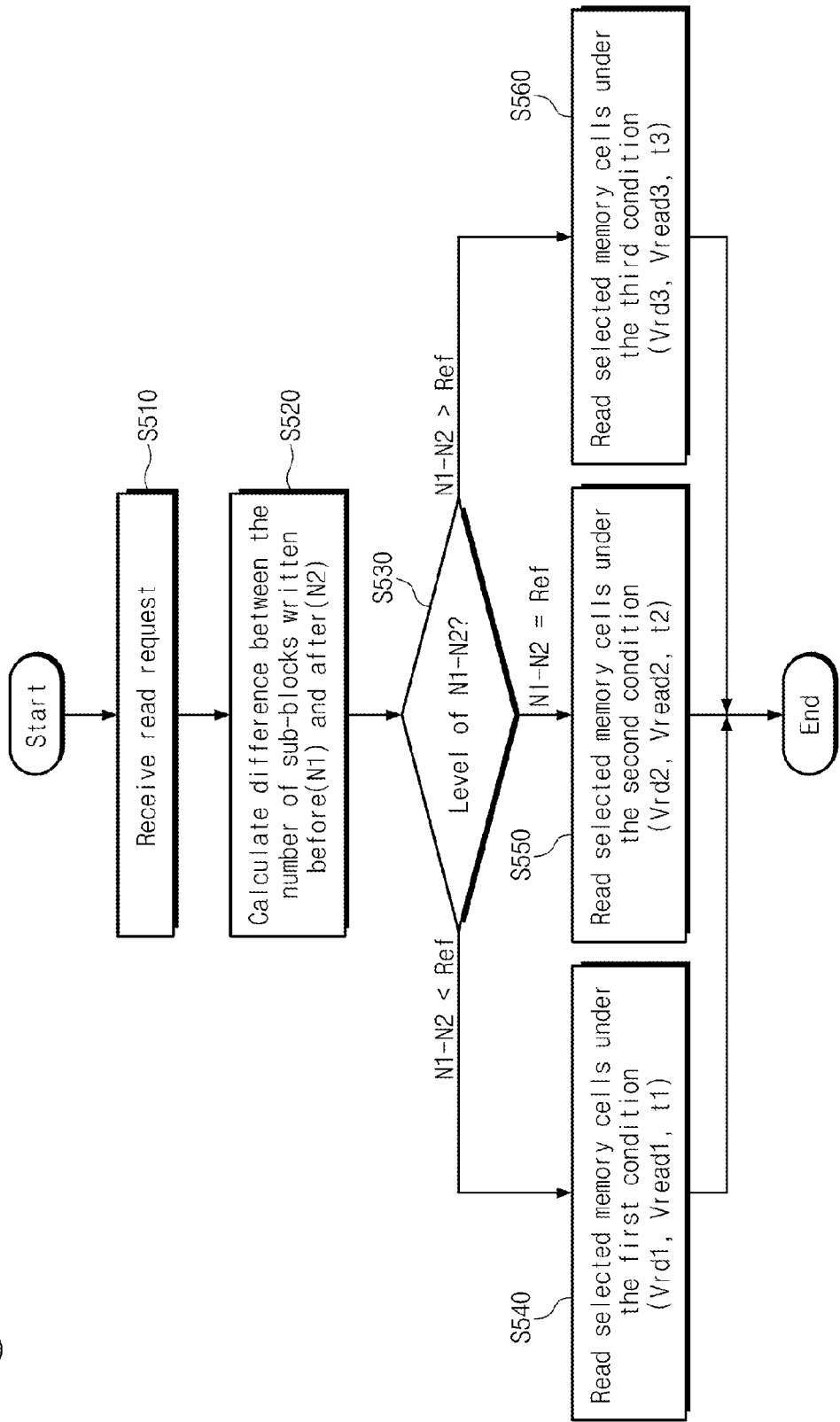
FIG. 16 is a flowchart illustrating a method of adjusting a read bias in the sub-blocks illustrated in FIG. 15.

FIG. 16 is a flowchart illustrating a method of adjusting a read bias in the sub-blocks illustrated in FIG. 15.

Referring to FIG. 16, memory controller 310 refers to sub-block state table 315 to obtain value N1 indicating the number of sub-blocks programmed before a sub-block selected for a read operation is programmed and a value N2 indicating the number of sub-blocks having a programmed state at a point of time when the selected sub-block is read. Various read biases (e.g., Vrd, Vread, sensing time, etc.) on selected memory cells may be adjusted based on the obtained values N1 and N2.

In operation S510, memory controller 310 receives a read request or a read command from a host. In operation S520, memory controller 310 checks sub-block state information associated with a selected sub-block in response to the read request of the host. For example, memory controller 310 may calculate a sub-block parameter of the selected sub-block according to program/erased states and erase count information of sub-blocks in each of memory blocks BLK0 to BLKi. For example, memory controller 310 may check the value N1 indicating the number of sub-blocks programmed before a selected sub-block, according to a sub-block state table 315. Also, memory controller 310 may check the value N2 indicating the number of sub-blocks having a programmed state at a point of time when the selected sub-block is read, according to a sub-block state table 315. Afterward, memory controller 310 may calculate a sub-block parameter (N1-N2) directly indicating a current state of the selected sub-block.

In operation S530, memory controller 310 determines a relationship between the sub-block parameter (N1-N2) and a reference value. If the value of the sub-block parameter (N1-N2) is smaller than the reference value, the method proceeds to operation S540. Otherwise, if the value of the sub-block parameter (N1-N2) is equal to the reference value, the method proceeds to operation S550. Otherwise, if the value of the sub-block parameter (N1-N2) is larger than the reference value, the method proceeds to operation S560.

In operation S540, memory controller 310 selects one of first conditions to sense the selected memory cells. For example, memory controller 310 may select a first selection read voltage Vrd1 to sense the selected memory cells. Alternatively, memory controller 310 may select a first non-selection read voltage Vread1 to be applied to an unselected word line when sensing the selected memory cells. Still alternatively, memory controller 310 may select a first sensing time t1 for sensing a sensing node when sensing the selected memory cells.

In operation S550, memory controller 310 selects one of second conditions to sense the selected memory cells. For example, memory controller 310 may select a second selection read voltage Vrd2 higher than first selection read voltage Vrd1 to sense the selected memory cells. Alternatively, memory controller 310 may select a second non-selection read voltage Vread2, higher than first non-selection read voltage Vread1, to be applied to an unselected word line when sensing the selected memory cells. Still alternatively, memory controller 310 may select a second sensing time t2, longer than the first sensing time t1, for sensing a sensing node when sensing the selected memory cells.

In operation S560, memory controller 310 selects one of third conditions to sense the selected memory cells. For example, memory controller 310 may select a third selection read voltage Vrd2 higher than second selection read voltage Vrd2 to sense the selected memory cells. Alternatively, memory controller 310 may select a third non-selection read voltage Vread2, higher than the second non-selection read voltage Vread2, to be applied to an unselected word line when sensing the selected memory cells. Still alternatively, memory controller 310 may select a third sensing time t3, longer than the second sensing time t2, for sensing a sensing node when sensing the selected memory cells.

In the example of FIG. 16, memory controller 310 compensates for a different between a bias state of a program point of time and a bias state of read point of time of the selected sub-block. That is, a read bias may be adjusted according to the number of sub-blocks programmed before a selected sub-block on the basis of a program point of time and the number of sub-blocks having a programmed state at a read point of time. Thus, it is possible to prevent the data integrity from being lowered by back pattern dependency and program disturbance.

Figure 17:
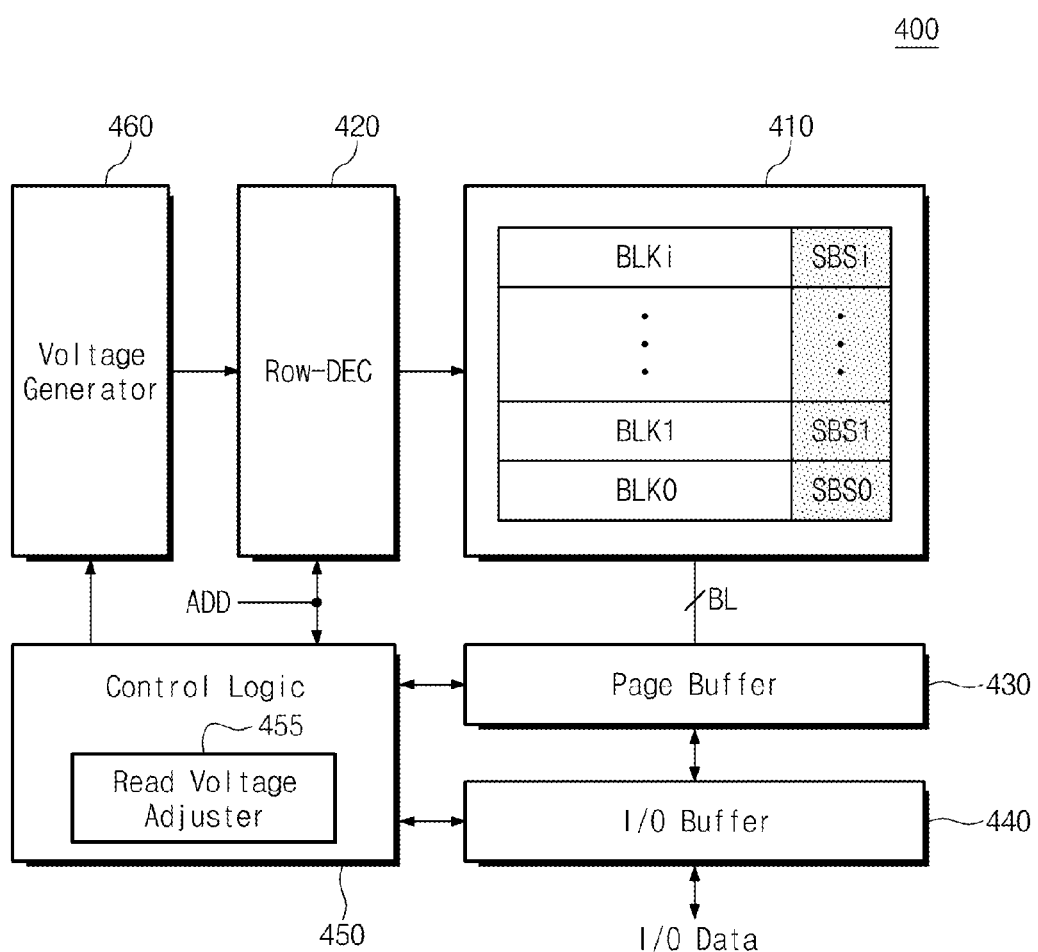
FIG. 17 is a block diagram illustrating a nonvolatile memory device according to still another embodiment of the inventive concept.

FIG. 17 is a block diagram illustrating a nonvolatile memory device according to still another embodiment of the inventive concept.

Referring to FIG. 17, a nonvolatile memory device 400 comprises a memory cell array 410, a row decoder 420, a page buffer circuit 430, an input/output buffer 440, control logic 450, and a voltage generator 460.

Memory cell array 410 is coupled with row decoder 420 via word lines and selection lines. Memory cell array 410 is coupled with page buffer circuit 430 via bit lines. Memory cell array 410 comprises a plurality of cell strings, and the cell strings constitute a plurality of memory blocks BLK0 to BLKi according to their operation or selection unit. Each of memory blocks BLK0 to BLKi may be divided into a plurality of sub-blocks.

Each memory block comprises a reserved area where state information of sub-blocks is recorded. A program/erased state and an erase count of each sub-block is stored in a reserved area in each memory block. This information is referred to as sub-block state information SBS0 to SBSi. Each of the cell strings comprises a channel formed in a direction perpendicular to a substrate. Word lines of memory cell array 410 are stacked in a direction perpendicular to a substrate, and channels of the cell strings are formed in the vertical direction.

Row decoder 420 selects a sub-block using the selection lines and a word line voltage. Row decoder 420 performs an access operation (e.g., program, erase and read operations) on the selected sub-block. Row decoder 420 erases memory cells by sub-block unit. In a sub-block erase operation, row decoder 420 erases one of a plurality of sub-blocks in a physical block and erase inhibits unselected sub-blocks.

Page buffer circuit 430 operates as a write driver or a sense amplifier according to a mode of operation. In a program operation, page buffer circuit 430 provides a bit line of memory cell array 410 with a bit line voltage corresponding to data to be programmed. In a read operation, page buffer circuit 430 senses data stored in a selected memory cell via a bit line. Page buffer circuit 430 latches the sensed data and outputs it to an external device via input/output buffer 440. In an erase operation, page buffer 430 floats the bit lines. In particular, page buffer circuit 430 may sense sub-block state information of a selected sub-block to provide it to control logic 450. In a sensing operation of selected memory cells, page buffer circuit 430 may further change a sensing time under control of control logic 450.

In a program operation, input/output buffer 440 transfers input write data to page buffer circuit 430. In a read operation, input/output buffer 440 transfers read data provided from page buffer circuit 430 to an external device. Input/output buffer 440 transfers input addresses or commands to control logic 450 or row decoder 420.

Control logic 450 controls page buffer circuit 430 and row decoder 420 in response to a command CMD transferred from the external device via input/output buffer 440. In an erase operation, control logic 450 controls row decoder 420 to erase a selected memory block (or, a physical block) or a sub-block. Control logic 450 may first obtain sub-block state information associated with a selected sub-block in response to a read command. To read sub-block state information, control logic 450 may control page buffer circuit 430 to sense a reserved area of a selected memory block. Sub-block state information SBSj read by page buffer circuit 430 may be provided to a read voltage adjuster 455 in control logic 450.

Read voltage adjuster 455 performs a read bias adjusting operation on selected memory cells according to sub-block state information SBSj. For example, read voltage adjuster 455 may adjust a read bias according to program/erased states of sub-blocks stacked on a selected sub-block in a direction perpendicular to a substrate. Alternatively, read voltage adjuster 455 may adjust a read bias according to program/erased states and erase counts of sub-blocks in a selected memory block including the selected sub-block. Voltage generator 460 or page buffer circuit 430 may be again configured according to a read bias determined by read voltage adjuster 455.

Voltage generator 460 generates a selection read voltage Vrd or a non-selection read voltage Vread that has been adjusted by read voltage adjuster 455. Voltage generator 460 generates word line voltages to be supplied to word lines and a voltage to be supplied to a bulk (e.g., a well region) where memory cells are formed. The word line voltages to be supplied to word lines may include, for instance, a program voltage, a pass voltage, or selection and non-selection read voltages.

Nonvolatile memory device 400 may be configured to read sub-block state information of a selected sub-block from a reserved area in response to a read command. A read bias on selected memory cells may be adjusted according to the read information. A read bias may be adjusted in the same manner as described above.

Figure 18:
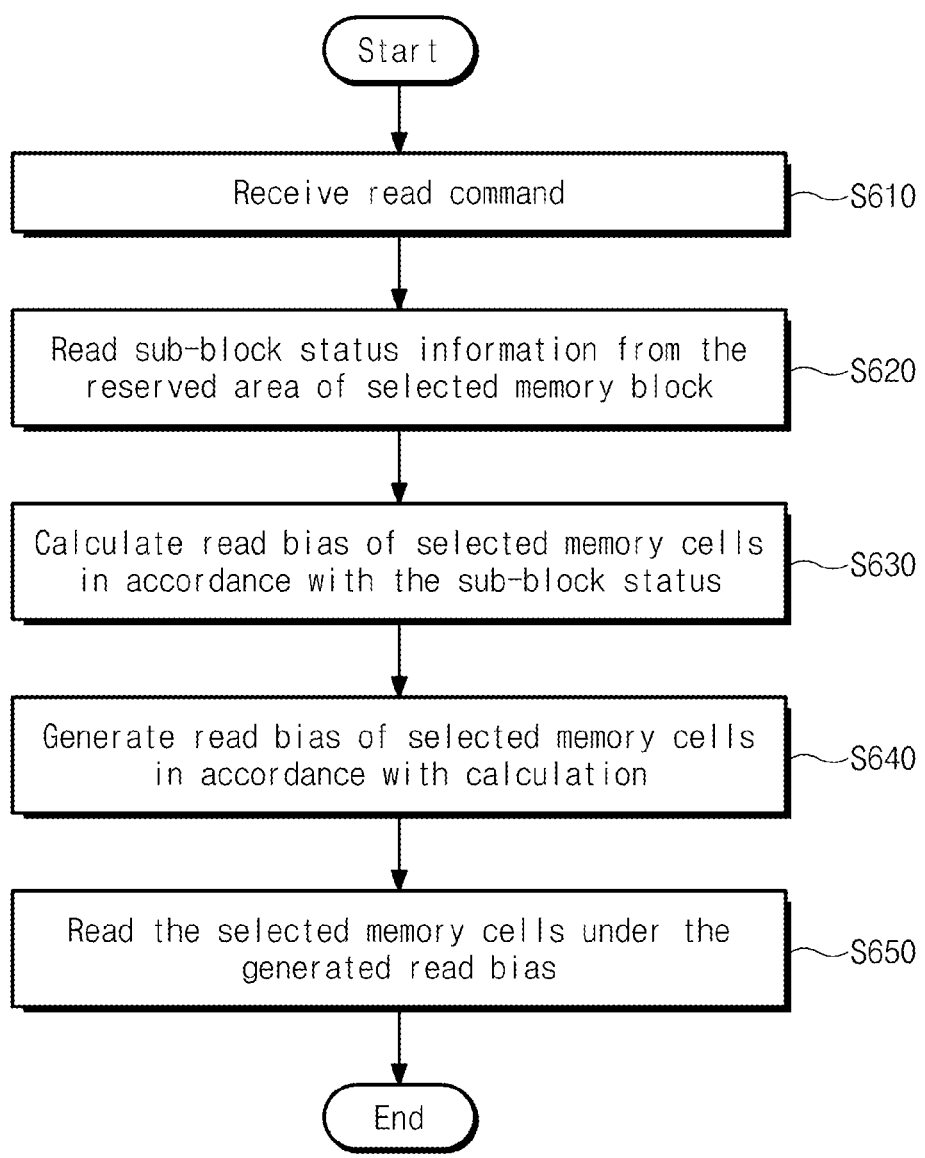
FIG. 18 is a flowchart illustrating a method of reading the nonvolatile memory device of FIG. 17.

FIG. 18 is a flowchart illustrating a method of reading nonvolatile memory device 400 of FIG. 17, according to an embodiment of the inventive concept.

Referring to FIG. 18, when a read command is received, nonvolatile memory device 400 performs a read bias adjusting operation according to sub-block state information associated with a selected sub-block.

In operation S610, control logic 450 receives a read command from an external device. In operation S620, control logic 450 detects states of sub-blocks associated with a selected sub-block. Control logic 450 controls a row decoder 420 and a page buffer circuit 430 to access a reserved area of a memory block corresponding to the selected sub-block. Sub-block state information SBSj read from the reserved area is provided from page buffer circuit 430 to control logic 450.

In operation S630, a read voltage adjuster 455 performs a read bias adjusting operation on selected memory cells according to sub-block state information SBSj. That is, read voltage adjuster 455 adjusts a read bias in consideration of previous or current states of sub-blocks associated with the selected sub-block. This read bias adjusting operation may be performed according to at least one of methods described with reference to FIGS. 8, 10, 14, and 16. For example, a read voltage Vrd of the selected memory cells may be adjusted according to sub-block state information SBSj. Alternatively, a non-selection read voltage Vread to be applied to unselected word lines may be adjusted according to sub-block state information SBSj. Still alternatively, a sensing time on selected memory cells may be adjusted according to sub-block state information SBSj. However, the inventive concept is not limited thereto. For example, a read bias on selected memory cells may be variously adjusted according to sub-block state information SBSj.

In operation S640, the determined read bias may be generated. That is, a selection read voltage Vrd or a non-selection read voltage Vread may be generated by a voltage generator 460. Where a sensing time is adjusted, a bias may be adjusted by reconfiguring page buffer circuit 430.

In operation S650, a read operation on the selected memory cells may be performed using the adjusted read bias.

With an embodiment of the inventive concept, it is possible to remarkably improve read margin of a nonvolatile memory device 400 performing an erase operation by a sub-block unit. Thus, the data integrity of a large-volume nonvolatile memory device may be improved.

Figure 19:
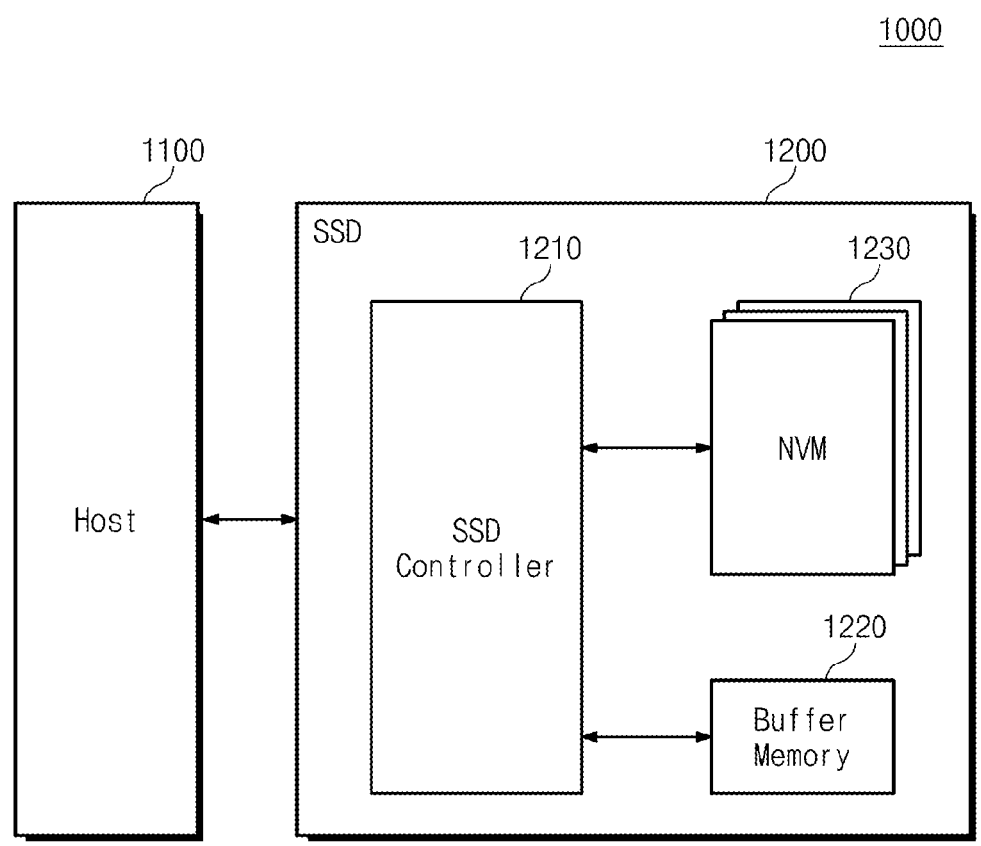
FIG. 19 is a block diagram illustrating a system comprising a solid state drive (SSD) according to an embodiment of the inventive concept.

FIG. 19 is a block diagram illustrating a system comprising a solid state drive according to an embodiment of the inventive concept.

Referring to FIG. 19, a system 1000 comprises a host 1100 and an SSD 1200. SSD 1200 comprises an SSD controller 1210, a buffer memory 1220, and a nonvolatile memory device 1230.

SSD controller 1210 provides a physical interconnection between host 1100 and SSD 1200. SSD controller 1210 provides an interface with SSD 1200 according to a bus format of host 1100. SSD controller 1210 decodes a command provided from host 1100 and accesses nonvolatile memory device 1230 based on a result of the decoding. A bus format of host 1100 may be, for instance, Universal Serial Bus (USB), Small Computer System Interface (SCSI), peripheral component interconnect (PCI) express, advanced technology attachment (ATA), Parallel ATA (PATA), Serial ATA (SATA), or Serial Attached SCSI (SAS).

Buffer memory 1220 temporarily stores write data provided from host 1100 or data read out from nonvolatile memory device 1230. Where data in nonvolatile memory device 1230 is cached, for a read request of host 1100, buffer memory 1220 may support a cache function to provide cached data directly to host 1100. Typically, a data transfer speed of a bus format (e.g., SATA or SAS) of host 1100 may be higher than that of a memory channel of SSD 1200. That is, where an interface speed of host 1100 is remarkably fast, lowering of the performance due to a speed difference may be minimized by providing buffer memory 1220 having a large storage capacity.

Buffer memory 1220 may be formed of a synchronous DRAM to provide sufficient buffering to SSD 1200 used as an auxiliary mass storage device. However, buffer memory 1220 is not limited to this disclosure.

Nonvolatile memory device 1230 functions as a storage medium of SSD 1200. For example, nonvolatile memory device 1230 may be formed of a vertical NAND flash memory device having a mass storage capacity. Nonvolatile memory device 1230 may be formed of a plurality of memory devices. In this case, the memory devices may be connected to SSD controller 1210 by a channel unit, respectively. As a storage medium, nonvolatile memory device 1230 may be formed of a NAND flash memory. However, nonvolatile memory device 1230 is not limited to a NAND flash memory device. For example, a storage medium of SSD 1200 can be formed of a PRAM, an MRAM, a ReRAM, a FRAM, a NOR flash memory, and the like. Further, the inventive concept may be applied to a memory system which uses different types of memory devices together. Nonvolatile memory device 1230 may be configured substantially the same as that described FIG. 3.

In SSD 1200, SSD controller 1210 may manage a memory block of nonvolatile memory device 1230 by a sub-block unit. In detail, SSD controller 1210 may have sub-block state information. That is, SSD controller 1210 may retain a program/erased state and erase count information by a sub-block unit. A read bias on selected memory cells may be adjusted according to the sub-block state information.

Figure 20:
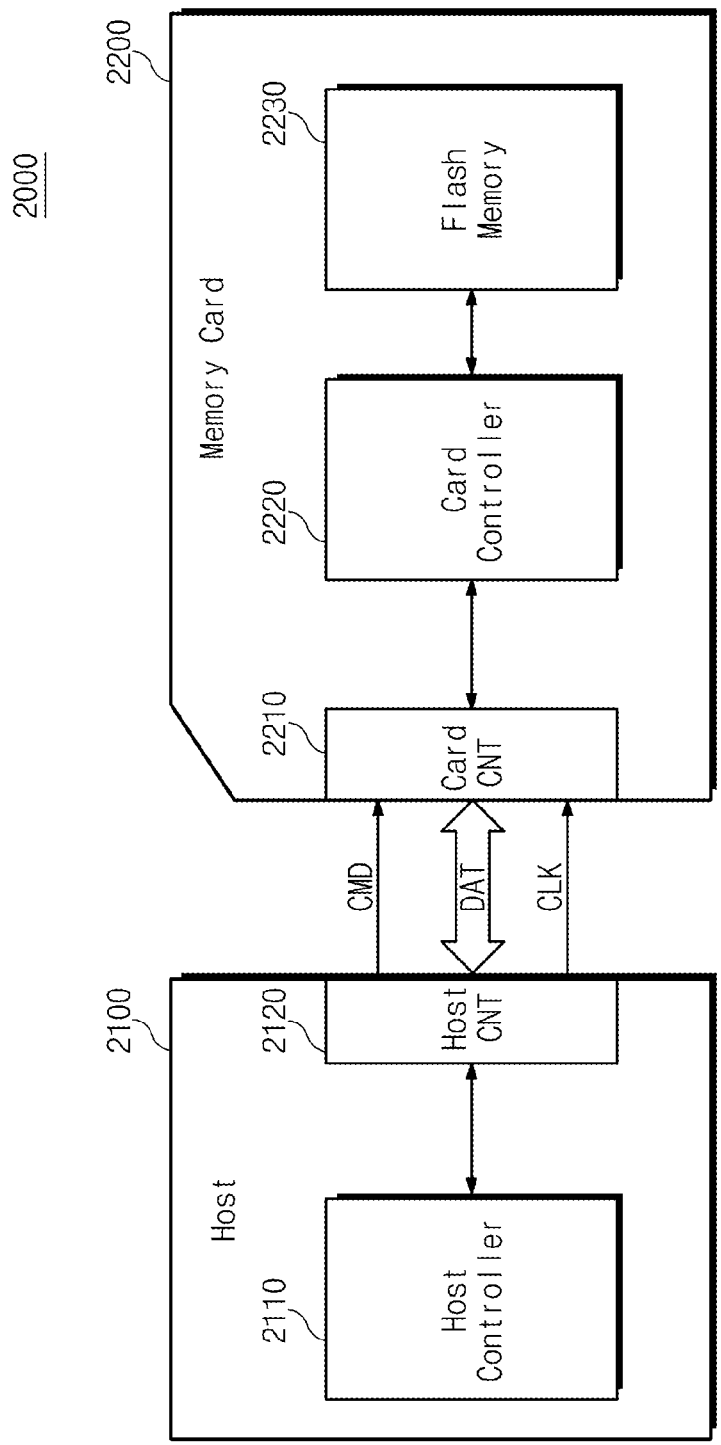
FIG. 20 is a block diagram illustrating a memory card system, according to an embodiment of the inventive concept.

FIG. 20 is a block diagram illustrating a memory card system, according to an embodiment of the inventive concept.

Referring to FIG. 20, a memory card system 2000 comprises a host 2100 and a memory card 2200. Host 2100 comprises a host controller 2110 and a host connection unit 2120. Memory card 2200 comprises a card connection unit 2210, a card controller 2220, and a flash memory 2230.

Each of host connection unit 2120 and card connection unit 2210 may comprise a plurality of pins. Such pins may include a command pin, a data pin, a clock pin, a power pin, etc. The number of pins may vary according to a type of memory card 2200. In example embodiments, an SD card may include nine pins.

Host 2100 is configured to write data in memory card 2200 or to read data stored in memory card 2200. Host controller 2110 sends a command (e.g., a write command), a clock signal CLK generated within a clock generator (not shown) of host 2100, and data to memory card 2200 via host connection unit 2120.

Card controller 2220 operates responsive to a write command received via card connection unit 2210, and stores data in memory 2230 in synchronization with a clock signal generated by a clock generator (not shown) of card controller 2220. Memory 2230 stores data transferred from host 2100. For example, where host 2100 is a digital camera, memory 2230 may store image data.

Flash memory 2230 comprises memory cells stacked in a direction perpendicular to a substrate. Flash memory 2230 may erase memory cells by a sub-block unit.

Card controller 2220 detects an erased state or an erase inhibition state by a sub-block unit of flash memory 2230. Also, card controller 2220 may manage a memory block of flash memory 2230 by a sub-block unit. In detail, card controller 2220 may have sub-block state information. That is, card controller 2220 may retain a program/erased state and erase count information by a sub-block unit. A read bias on selected memory cells may be adjusted according to the sub-block state information.

Card connection unit 2210 may be configured to communicate with an external device (e.g., a host) using one of various interface protocols such as USB, MMC, PCI-E, SAS, SATA, PATA, SCSI, ESDI, IDE, and the like.

Figure 21:
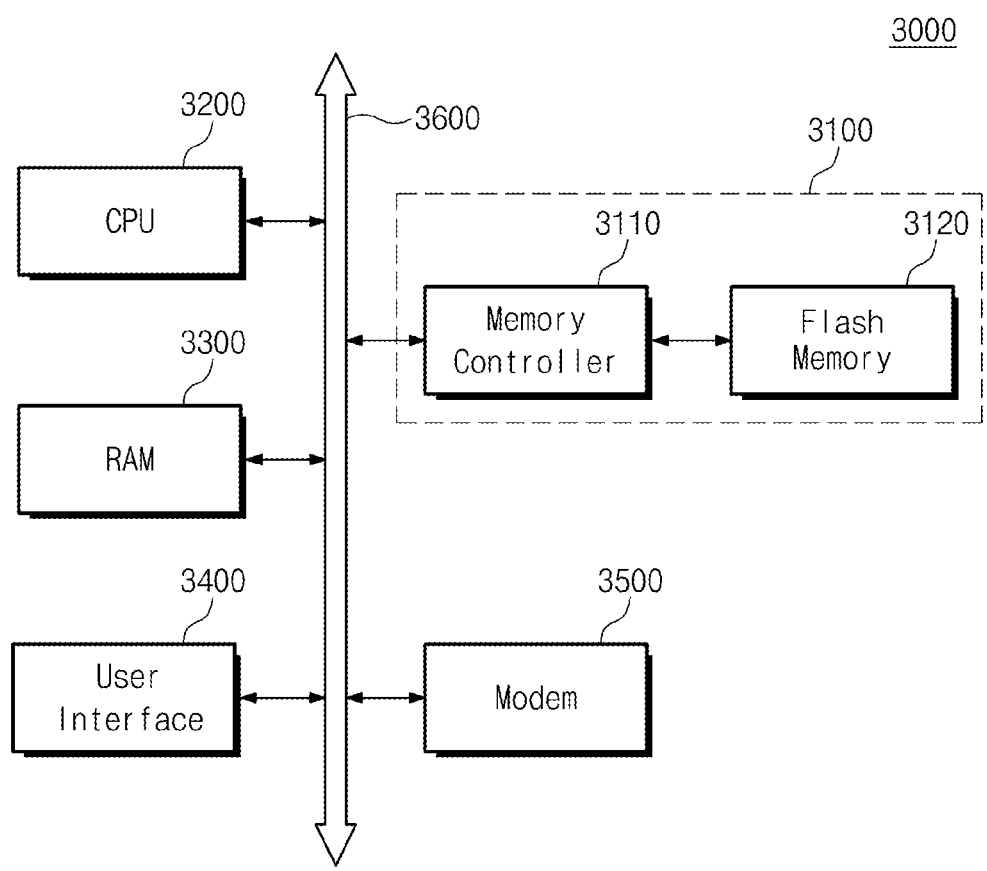
FIG. 21 is a block diagram illustrating a computing system comprising a flash memory device, according to an embodiment of the inventive concept.

FIG. 21 is a block diagram illustrating a computing system comprising a flash memory device 3120 according to an embodiment of the inventive concept.

Referring to FIG. 21, a computing system 3000 comprises a CPU 3200, a RAM 3300, a user interface 3400, a modem 3500 such as a baseband chipset, and a memory system 3100 which are electrically connected with a system bus 3600. Memory system 3100 may be configured the same as an SSD in FIG. 19 or a memory card in FIG. 20. Where computing system 3000 is a mobile device, it may further include a battery (not shown) which powers computing system 3000.

Although not shown in FIG. 21, computing system 3000 may further include an application chipset, a camera image processor (CIS), a mobile DRAM, and the like. Memory system 3100 may be an SSD which uses a nonvolatile memory to store data. Alternatively, memory system 3100 may be formed of a fusion flash memory (e.g., a One-NAND flash memory).

Memory controller 3110 detects an erased state or an erase inhibition state by a sub-block unit of flash memory device 3120. Also, memory controller 3110 may manage a memory block of flash memory device 3120 by a sub-block unit. In detail, memory controller 3110 may have sub-block state information. That is, memory controller 3110 may retain a program/erased state and erase count information by a sub-block unit. A read bias on selected memory cells may be adjusted according to the sub-block state information.

A nonvolatile memory device and/or a memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a nonvolatile memory device configured to erase a memory block in sub-block units, comprising:
   detecting a state information of unselected sub-blocks associated with a selected sub-block comprising selected memory cells;
   adjusting a read bias of the selected memory cells based on the state information; and
   reading data from the selected memory cells according to the adjusted read bias,
   wherein the state information indicates a number of the unselected sub-blocks having a programmed state or an erased state.

2. The method of claim 1, wherein the unselected sub-blocks associated with the selected sub-block comprise at least one sub-block stacked on the selected sub-block in a direction perpendicular to a substrate.

3. The method of claim 2, wherein the state information comprises a number of the at least one sub-blocks in the erased state.

4. The method of claim 3, wherein the selected memory cells are read according to a first selection read voltage where the number of sub-blocks in the erased state is greater than a reference value and according to a second selection read voltage higher than the first selection read voltage where the number of sub-blocks in the erased state is less than the reference value.

5. The method of claim 3, wherein a first non-selection read voltage is applied to an unselected word line where the number of sub-blocks in the erased state is greater than a reference value and a second non-selection read voltage higher than the first non-selection read voltage is applied to an unselected word line where the number of sub-blocks in the erased state is less than the reference value.

6. The method of claim 3, wherein the selected memory cells are sensed during a first sensing time where the number of sub-blocks in the erased state is greater than a reference value and during a second sensing time longer than the first sensing time where the number of sub-blocks in the erased state is less than the reference value.

7. The method of claim 1, wherein the unselected sub-blocks associated with the selected sub-block include sub-blocks in a memory block including the selected sub-block.

8. The method of claim 7, wherein the state information comprises a first sub-block number N1 corresponding to the number of sub-blocks programmed before the selected sub-block and a second sub-block number N2 corresponding to the number of sub-blocks having a programmed state at a point of time where the selected memory cells are read.

9. The method of claim 8, wherein a read bias on the selected memory cells is adjusted based on a difference (N1-N2) between the first sub-block number N1 and the second sub-block number N2.

10. The method of claim 9, wherein the selected memory cells are read using a first selection read voltage where the difference is greater than a reference value, using a second selection read voltage higher than the first selection read voltage where the difference is equal to the reference value, and using a third selection read voltage higher than the second selection read voltage where the difference is less than the reference value.

11. The method of claim 9, wherein unselected word lines are supplied with a first non-selection read voltage where the difference is greater than a reference value, with a second non-selection read voltage higher than the first non-selection read voltage where the difference is equal to the reference value, and with a third non-selection read voltage higher than the second non-selection read voltage where the difference is less than the reference value.

12. The method of claim 9, wherein the selected memory cells are read during a first sensing time where the difference is greater than a reference value, during a second sensing time longer than the first sensing time where the difference is equal to the reference value, and during a third sensing time longer than the second sensing time where the difference is less than the reference value.

13. A memory system, comprising:
   a nonvolatile memory device comprising a memory block erased in sub-block units; and
   a memory controller configured to control the nonvolatile memory device to adjust a read bias for selected memory cells in a selected sub-block of the memory block based on a state information of other sub-blocks in the memory block,
   wherein the state information comprises information indicating whether each sub-block is erased and erase counts of the sub-blocks.

14. The memory system of claim 13, wherein an erase count of each of the sub-blocks in the memory block is calculated after the memory block is erased.

15. The memory system of claim 13, wherein the state information is stored in a table of the memory controller or in a reserved area of the nonvolatile memory device.

16. A memory controller configured to control a nonvolatile memory device configured to erase a memory block in sub-block units, comprising:
   control logic configured to detect a state information of unselected sub-blocks associated with a selected sub-block comprising selected memory cells; and a read voltage adjuster configured to adjust a read bias of the selected memory cells based on the state information;

wherein the memory controller reads data from the selected memory cells according to the adjusted read bias, and wherein the state information indicates a number of the unselected sub-blocks having a programmed state or an erased state.

17. The memory controller of claim 16, wherein the unselected sub-blocks associated with the selected sub-block comprise at least one sub-block stacked on the selected sub-block in a direction perpendicular to a substrate.

18. The memory controller of claim 17, wherein the state information comprises a number of the at least one sub-blocks in the erased state.

19. The memory controller of claim 16, wherein the unselected sub-blocks associated with the selected sub-block include sub-blocks in a memory block including the selected sub-block.

20. The memory controller of claim 19, wherein the state information comprises a first sub-block number N1 corresponding to the number of sub-blocks programmed before the selected sub-block and a second sub-block number N2 corresponding to the number of sub-blocks having a programmed state at a point of time where the selected memory cells are read.

* * * * *